United States Patent [19]

Cummings, III et al.

[11] Patent Number: 4,757,263

[45] Date of Patent: Jul. 12, 1988

[54] INSULATION POWER FACTOR ALARM MONITOR

[75] Inventors: Harold B. Cummings, III; Frank A. Deviney, both of Chattanooga, Tenn.

[73] Assignee: Tennessee Valley Authority, Muscle Shoals, Ala.

[21] Appl. No.: 44,919

[22] Filed: May 1, 1987

[51] Int. Cl.[4] .................................................. G01R 31/00
[52] U.S. Cl. ........................... 324/552; 324/60 R; 324/126; 364/551
[58] Field of Search ............... 324/552, 551, 548, 509, 324/60 R, 126; 361/126, 127, 128; 364/551

[56] References Cited

U.S. PATENT DOCUMENTS 3,710,242  1/1973  Povey .................................. 324/552
4,577,148  3/1986  Sweetana ......................... 324/552 X Primary Examiner—Reinhard J. Eisenzopf
Assistant Examiner—Robert W. Mueller
Attorney, Agent, or Firm—Robert A. Petrusek

[57] ABSTRACT

The present invention teaches a technique and provides for apparatus eminently useful for the continuous, simultaneous monitoring of the insulation quality of one or more pieces of high voltage ac electrical equipment, while the equipment is in service and connected to its normal high voltage source. The technique or method of the instant invention involves comparing a voltage, developed across a capacitive shunt at the capacitance tap of a transformer or bushing so equipped with a reference voltage taken from a voltage transformer or potential device connected to the same high voltage source. The effecting of the instant technique requires only a minimal amount of relatively inexpensive attendant centralized control equipment and is simply and easily placed into practice by, for example, such a centralized control unit which automatically computes and displays or prints the insulation power factor and/or capacitance, either continuously or at regular intervals for each piece of said ac electrical equipment being monitored by means of the instant invention such that, for example, alarms are sounded and contacts close when the power factor for any such piece being so monitored reaches preset limits. In addition, said central control unit may also make temperature corrections, compute averages, and indicate short-term and long-term trends.

15 Claims, 12 Drawing Sheets

DIAGRAM OF COMPUTER EQUIPMENT
USED IN THE SECOND EMBODIMENT

SCHEMATIC DIAGRAM OF FREQUENCY MULTIPLIER
USED IN SECOND EMBODIMENT

INSULATION POWER FACTOR ALARM MONITOR

The invention herein described may be manufactured and used by and for the Government for governmental purposes without the payment to us of any royalty therefor.

INTRODUCTION

The present invention relates to a new, novel, and relatively simple and inexpensive, as well as highly efficient and reliable system, including apparatus means and methods for effecting same for the simultaneous monitoring of a plurality of high voltage ac apparatus to determine quantitatively the insulating characteristics thereof through the mechanism and technique of measuring either the power factor or the capacitance of the dielectrics involved. The power factor of electrical insulation has long been recognized as a good indication of its quality and future serviceability. Almost any form of degradation of the insulation will, sooner or later, increase its power factor. Capacitance, too, can be an indication of its quality, especially if the insulation is in layers with conductive shields therebetween. For instance, one of the layers thereof can completely fail and short out, thus increasing the capacitance, since the layers are effectively capacitors in series.

The present invention teaches and describes apparatus and means for effecting the utilization thereof which will continuously monitor the insulation power factor and capacitance of almost any type of high voltage ac electrical equipment, such as bushings of instrument transformers, which equipment has a capacitance tap. (As will be appreciated by those skilled in this art, a capacitance tap is a connection brought out from the shield closest to ground, across the bottom insulation layer, for use as a potential tap or for test purposes.) The instant invention and the apparatus employed in the conduct thereof effectively compares the capacitance tap current with the applied voltage, taken from a voltage transformer, and computes power factor and capacitance by adaptations from the following formulas:

$$\text{POWER FACTOR} = \left( \int_0^T v i \, dt \right) / (VIT)$$

$$\text{POWER FACTOR} = \cos(A) \approx \pi/2 - A$$

$$\text{CAPACITANCE} = I/(2\pi f V)$$

where v and i are the instantaneous values of reference voltage and capacitance tap current, respectively, V and I are the RMS values of the same voltage and current, T is one period of line frequency, f is the system frequency, and A is the phase angle (expressed in radians) by which i leads v. Since A is normally between 1.47 and $\pi/2$ (i.e., 84 to 90 degrees, with the power factor 10 percent or less), the approximations are valid.

In the practice of the instant invention the power factor and capacitance values of the particular pieces of equipment being monitored thereby are automatically computed by the apparatus comprising same and are, either continuously (in the analog embodiment) or intermittently in short-time sequence (using a digital microcomputer) reported. The analog embodiment provides continuous data output and may be utilized to activate alarms for certain preset conditions. Operation of the computerized embodiment of the present invention may be used to, among other things, print data at regular intervals, make temperature corrections, compute averages and trends, and determine alarm conditions.

BACKGROUND OF THE INVENTION

1. Field of the Invention

The present invention relates to methods and means for test monitoring electrical power equipment—in particular, the insulating values of the dielectrics comprising means for confining the course of electric currents to prescribed conducting paths in and on high voltage ac electrical power equipment. By continuously, accurately, and rapidly monitoring such insulation power factor and/or capacitance, the instant invention provides for field testing, under a plethora of adverse conditions of external electrical stress and the like, for correctly indicating the true condition of same to determine whether or not it is safe to leave the equipment in service in the immediate future.

2. Description of the Prior Art

It has been noted that numerous prior art investigators have discovered, taught, and disclosed methods and/or means for determining the immediate condition of the insulating materials comprising various parts and configurations of ac electrical equipment, including that of the type used in applications of relatively high voltage. For example, the teachings of U.S. Pat. No. 1,945,263, Doble, Jan. 30, 1934, assigned to Doble Engineering Company relates to apparatus useful for measuring power factor. Doble's apparatus accurately measures insulation power factor and capacitance of electrical equipment, but is taught with the following limitations:

1. The equipment to be tested must be taken out of service and disconnected from associated equipment.
2. The equipment is tested at a voltage that is much lower than its operating voltage. This is a consideration of considerable importance when it is realized that on some (particularly older) equipment, the insulation power factor is significantly higher when in service than can be measured by a low voltage test.
3. The test can be conducted by at one point in time and must therefore be repeated periodically to establish trends in insulation quality. In many instances this is a formidable drawback since many times, it simply is not practical to test the insulation of a given piece of equipment often enough to detect deterioration thereof before it leads to rapid failure.
4. Each test requires hands-on attention by an operator.
5. Only one piece of equipment can be tested with any one test setup.

Other prior art investigators have taught and disclosed other methods and/or means for determining the immediate condition of such insulating materials. U.S. Pat. No. 3,710,242, Povey, Jan. 9, 1973, assigned to Doble Engineering Company discloses apparatus which effectively eliminates limitations (1) and (2) above. In a manner somewhat similar to the apparatus described and used in the present invention, Povey's apparatus measures power factor and capacitance by comparing a voltage derived from the capacitance tap with a reference potential. Unfortunately his advancement of the prior art does not eliminate limitations (3), (4), and (5) supra, and (as pointed out in Povey's disclosure) generally requires long, shielded leads to a voltage transformer (or other suitable reference with a known phase relationship) which may be located a long distance from the equipment being tested. For repeated tests, these leads must either be left in place indefinitely or rerun for each test.

The apparatus of the instant invention and the means and methods of employment of same effectively eliminates all five of the limitations mentioned above by providing automatic, continuous monitoring, with the equipment that is to be tested in service and energized at its operating voltage, and with minimal human interface. In addition, the practice of the present invention provides for apparatus which may be used to compute temperature corrections, averages, and short-term and long-term trends. It also gives alarms and can be connected to trip equipment out of the service under certain preset conditions. In contrast to the inventions of the type of the prior art, which test only one piece of equipment at a time, the present invention provides for apparatus which may be used to monitor any number of pieces of equipment simultaneously. As with Povey's equipment, leads must be run to a voltage transformer or other suitable reference, but only one (2-conductor, shielded) lead must be run for each phase of each voltage on which equipment is to be monitored, regardless of the number of pieces of equipment. A separate lead must be run from each piece of monitored equipment to the invention apparatus, which is usually located in the switchhouse or other central, sheltered location.

Of course, not all of the investigators of the prior art have directed their approaches to solving many of these problems heretofore associated with determining the state, or condition of, insulating materials normally associated with equipment of the type herein described to the determination of power factor and/or capacitance characteristics. One such other approach to advancing the state of this art is found in the teachings of U.S. Pat. No. 4,293,399, Belanger et al., Oct. 6, 1981, assigned to Hydro-Quebec wherein is described apparatus which is employed to monitor the hydrogen gas dissolved in insulating oil. This apparatus of Belanger may be employed as a continuous monitor, and thus eliminates the first four of the five limitations mentioned above for the original Doble apparatus. The Belanger et al. invention monitors hydrogen gas only on one piece of equipment; no other gasses are monitored and no electrical properties are monitored. The device provides alarms, but no hard data copies or trend analysis. An output is provided so the user can connect a strip-chart recorder if he so desires. Although the teaching of Belanger et al. have been reported to advance the state of this art it must be realized that, of course, the dissolved hydrogen monitor approach of this invention is not applicable to equipment that does not use oil in its insulation system.

Just which type of monitoring system (power factor/capacitance or dissolved hydrogen) provides the more desirable indication of insulation quality has been the subject of some debate. To this end, TVA has developed data which strongly indicates that power factor measurement provides a more reliable indication of insulation quality than hydrogen gas content, and usually indicates a destructive trend earlier, at least on some equipment which is not especially suited for gas monitoring. In any event, it should be noted that the apparatus described in the practice of the present invention can monitor (and compute averages and trends on) both power factor and hydrogen if the hydrogen monitor described above is installed and its output is wired into said apparatus.

SUMMARY OF THE INVENTION

The instant invention relates to a vastly improved technique, including methods and means, for utilizing the capacitance tap of each piece of equipment to be monitored by fitting same with a capacitance tap adaptor, which capacitance tap adaptor contains a pair of precision, low-loss capacitors (the polystyrene type is preferred) to serve as a shunt. The values of the two capacitors are selected to produce a voltage drop of 10-to-140 volts ac to ground. A reference voltage, usually 67 or 120 volts ac to ground, is normally taken from a voltage transformer connected to the same source as the equipment to be monitored. Each of these voltages passes through a differential attenuator/amplifier which scales the voltage and reduces common-mode interference. The amplifiers also contain protective circuitry and low-pass filters to reduce transients and high frequency interference. The amplifier outputs are ac voltages with maximum amplitudes of about 5 volts.

In the first embodiment of the present invention, the amplifier outputs feed into an analog circuit that measures the phase angle between them. At power factor of 10 percent or less, this phase angle (in radians) is an excellent approximation of the power factor, since it is effectively subtracted from $\pi/2$ (90 degrees) by the purely capacitive shunt at the capacitance tap. The power factor is read on a digital panel meter; also, 0-to-10 volt and/or 0-to-1 milliampere dc signals are made available for driving a strip-chart recorder. Alarm/trip contacts close when preset power factor limits are exceeded.

In the second embodiment of the instant invention, a microcomputer is used, with analog-to-digital converters (ADC), input-output (IO) ports, a printer, and other peripherals to interface with the real world. The amplifier outputs described above are sampled 32 times each cycle of ac by the computer-controlled ADC. A frequency multiplier, which uses a phase-locked loop locked to the reference voltage, precisely sets the sample rate. The computer, using the discrete numbers derived from the samples, computes power factor and capacitance by doing numerical integration and other necessary arithmetic. With this method, the power factor is accurate over the full theoretical range, rather than only up to about 10 percent as in the phase angle procedure of the first embodiment supra. These computations of power factor and capacitance are generally made once each minute. In addition, temperature corrections, averages, trends, and comparisons with limits are also computed. All these data are printed at regular intervals and other opportune times. Alarm/trip outputs are provided when certain preset limits are exceeded.

OBJECTS OF THE INVENTION

It is therefore the principal object of the present invention to develop a new method and/or means for easily, quickly, accurately, and continuously monitoring the insulation quality of high voltage ac electrical equipment.

It is another object of the present invention to develop a new method and/or means for easily, quickly, accurately, and continuously monitoring the insulation quality of high voltage ac electrical equipment wherein same is accomplished by providing a continuous readout and/or record of power factor and capacitance, along with alarm/trip outputs.

Still further and more general objects and advantages of the present invention will appear from the more detailed description set forth below, it being understood, however, that this more detailed description is given by way of illustration and explanation only, and not necessarily by way of limitation since various changes therein may be made by those skilled in the art without departing from the true spirit and scope of the present invention.

BRIEF DESCRIPTION OF THE DRAWINGS

The present invention will be better understood from a consideration of the following description taken in connection with the accompanying drawings in which.

DETAILED DESCRIPTION OF THE DRAWINGS

For the sake of clarity and a better understanding of the applicability of the illustrations of the various drawings a more detailed description of the same is given below.

Figure 1:
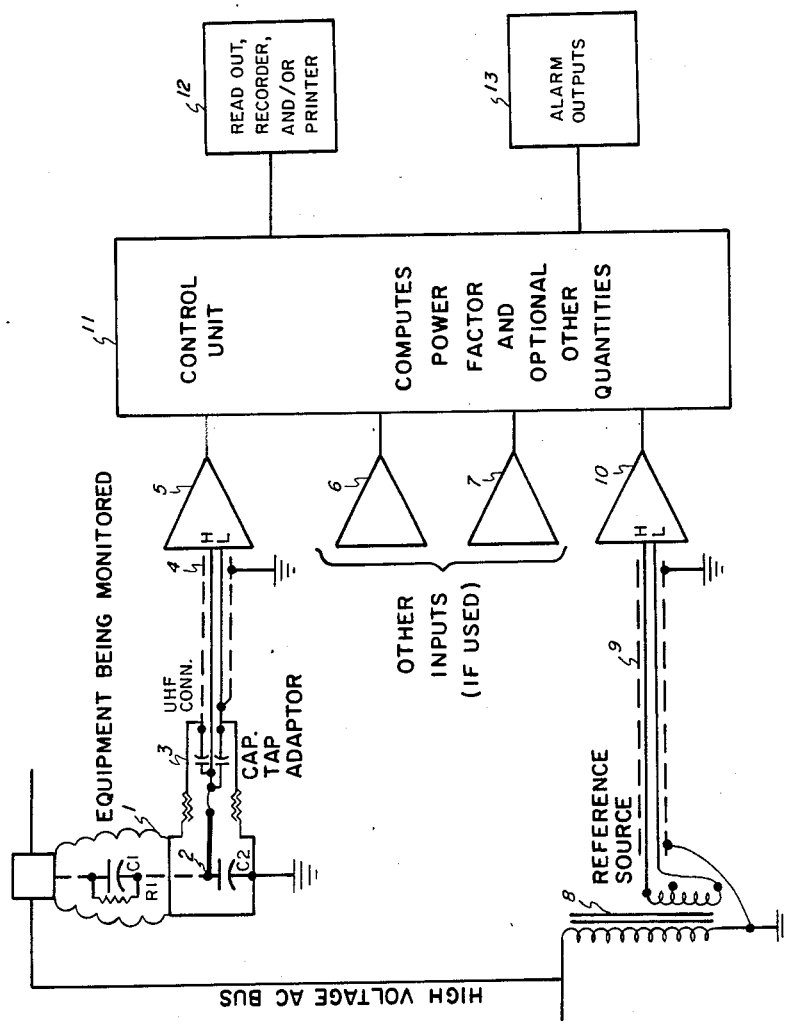
FIG. 1 diagrammatically illustrates either of two principal embodiments of the apparatus comprising the instant invention.

Referring now more specifically to FIG. 1, equipment being monitored (1) is a high voltage bushing or an instrument transformer. It is represented schematically by $C_1$ and $C_2$, with capacitance tap (2) bringing out the connection between $C_1$ and $C_2$. $C_1$ is actually the primary insulation, the quality of which is to be monitored. $C_1$ is usually constructed in layers of oil-impregnated paper (the insulation) separated by conductive shields which equalize the electric field. Therefore, $C_1$ is, in effect, several capacitors in series, with the impedance of $C_1$ representing the net impedance of the series string. $C_2$ represents the bottom layer of insulation, which is shorted out whenever the capacitance tap is grounded. Those knowledgeable in the field of high voltage insulation will be familiar with this construction and terminology.

Ideally, capacitance $C_1$ is a pure capacitance with no dielectric losses. In practice, there will be some loss, which is prepared by $R_1$, shown in parallel with $C_1$. If the loss is high enough (represented by a low value of $R_1$), significant heating will occur in the insulation. This heating is proportional to the watts loss and is given by:

$$W = V^2/R_1$$

where W is watts loss, V is the system (line-to-ground) voltage, and $R_1$ is the equivalent parallel resistance of the insulation.

$R_1$ is an equivalent resistance (rather than an actual physical resistor) which is inconvenient to measure. The watts loss can also be determined from the capacitance, voltage, and power factor of $C_1$, as follows:

$$PF = COS(A)$$

$$C \simeq I/(2\pi fV)$$

$$W = VI\, COS(A)$$

$$W \simeq 2\pi fCV^2 COS(A) \text{ or } W \simeq 2\pi fCV^2(PF)$$

where PF is the insulation power factor, C is the capacitance (of $C_1$), I is the insulation current, A is the phase angle that V lags I, and f is system frequency. Since V and f are known to a reasonable degree of accuracy, and PF and C are measured by the central control and monitoring unit of the instant invention, hereinafter normally referred to, for the sake of simplicity, as the apparatus, the watts loss can be determined. (Actually, in most instances, the capacitance of $C_1$ is also known, and need not be measured, except that it also can give an indication of insulation quality.)

The watts loss of the insulation is very significant because the temperature rise inside the insulation is directly proportional to this loss. High temperature causes further deterioration of the insulation, which causes even higher loss, and so on, until the equipment eventually fails.

In practice, the power factor itself, which is a fundamental property of the insulation and a widely recognized indicator of insulation quality, is more useful than watts loss. It should be recognized, however, that low capacitance bushings can tolerate a higher power factor than high capacitance bushings. At any rate, the apparatus of the instant invention, while accurately monitoring the true power factor, primarily looks for increases in power factor beyond what can be expected because of temperature fluctuation.

Capacitance tap (2) is connected to ground through an impedor means, i.e. a capacitive shunt, of very low reactance and is illustrated as contained in capacitance tap adapter (3). The voltage developed across the capacitive shunt is determined almost solely by the current through $C_1$ and lags this current by a phase angle of almost exactly 90 degrees. This voltage is passed through 2-conductor, shielded cable (4) to voltage interface amplifier (5), which reduces it to a filtered, protected voltage compatible with control unit (11) input requirements (approximately 5 volts). Amplifiers (6) and (7) accept additional inputs, if any.

Reference source (8) (shown as a magnetic potential transformer connected to the same high voltage bus as the equipment being monitored) develops a voltage which is a known fraction of the bus voltage and precisely in phase with it. This voltage is passed through 2-conductor, shielded cable (9) to voltage interface amplifer (10), which reduces it to a voltage similar to that developer by voltage interface amplifier (5).

Potential transformer (8) should be as accurate as possible (0.3 percent preferred) and also as lightly loaded as possible. Normal loading is acceptable if cable (9) goes all the way to the transformer, thus bypassing the cable voltage drop caused by normal metering and/or relaying loads. These loads can cause errors as high as 2 percent power factor and/or capacitance if their cable is not bypassed.

A capacitive potential device can be used as a reference source if it is carefully tuned and phase tested. A phase error of one degree will cause a 1.75 percent power factor error. Once tuned, the loading of the potential device should not be changed.

Control unit (11) computes power factor by either of two methods to be described later. Capacitance may also be computed. The results are displayed continuously or recorded on readout device (12). If certain preset conditions are exceeded, or upward unexplainable trends are observed, notes or other indications may be printed by (12), and alarm circuit (13) may close contacts or provide some other type of alarm output. This alarm output may be used only for alarm purposes, or may initiate tripping to remove the monitored equipment from service before it fails.

Figure 2:
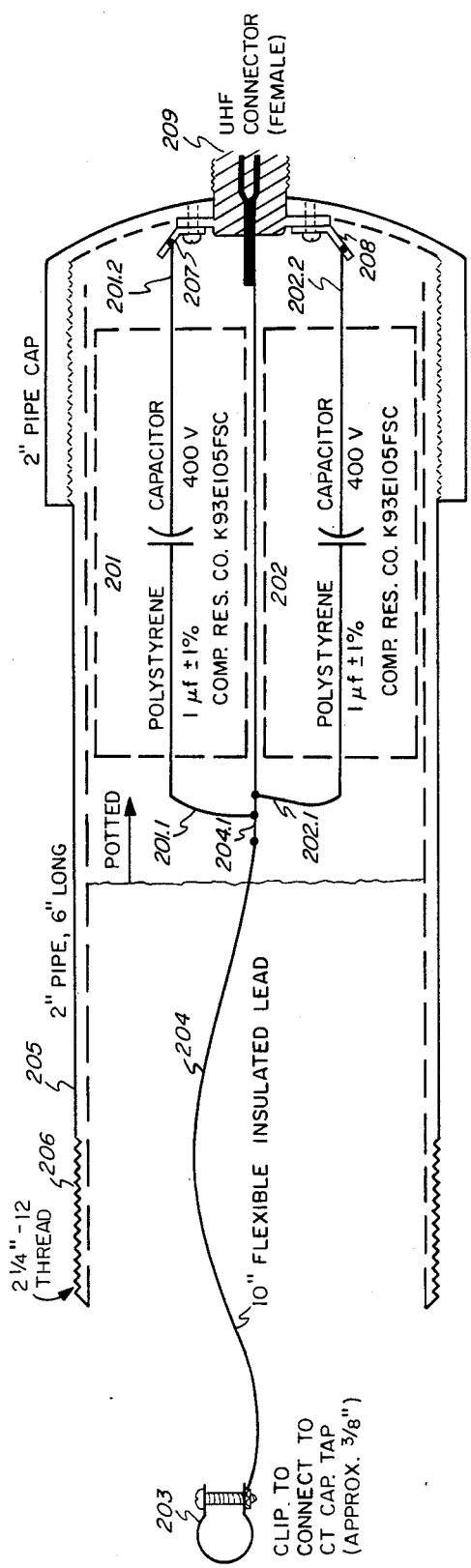
FIG. 2 illustrates by means of a scaled drawing and wiring diagram, a capacitance tap adaptor of the type described herein.

Referring now more specifically to FIG. 2 therein is shown an example of a capacitance tap adaptor designed for TVA current transformers. A capacitance tap adaptor for other equipment would, in general, take a different form; however, certain parameters are necessary, as described below.

The main components of the capacitance tap adaptor are shunt capacitors (201) and (202). The value of the capacitors is selected so that, added together, they provide a shunt to ground that, with normal insulation current flowing through it, develops a voltage of between about 10 and about 140 volts RMS. Since the normal voltage of an open circuit capacitance tap is usually about 10,000 volts, the voltage developed is determined almost solely by the insulation current, with other factors having an effect of about 1 percent or less. The type capacitor is also important; the dissipation factor (or power factor) of the two capacitors should be very low or at least a precisely known, stable value. The specified capacitors have a dissipation factor of 0.02 to 0.03 percent at 60 Hz. For ultimate accuracy, this factor is added to the insulation power factor measured by the apparatus.

Clip (203) is used to connect to the capacitance tap. In this case, the connection is to a center pin in the capacitance tap, about ⅜-inch (0.95 cm) in diameter. The entire adaptor is housed in a 2-inch (5.08 cm) diameter pipe nipple 6 inches (15 cm) long (205), which screws into the capacitance tap housing using the 2¼ inch, 12 per inch (5.715 cm, 4.724 per cm) threads (206) machined onto the pipe. The keep flexible lead (204) from twisting too much, the adaptor is twisted ccw several turns after connecting to the center pin and before starting to screw the pipe nipple into the capacitance tap. Thusly, the lead can untwist as the nipple is started cw into the capacitance tap.

It is noted that the principal reason for using two capacitors, instead of one of twice the value of capacitance, is to limit the voltage in case of capacitor failure.

For instance, if only one capacitor is used, and if fails open, or a lead breaks, the output voltage from the capacitance tap adaptor could increase to about 10,000 volts, damaging the apparatus and constituting a safety hazard. However, when two capacitors are utilized as shown, the output voltage is limited to 20 to 280 volts, unless both should fail simultaneously, an eventually considered highly unlikely if the capacitor voltage rating is more than twice the expected normal output voltage. An open capacitor will normally be detected by the fact that the insulation capacitance indicated by the apparatus would be twice the correct value.

An important consideration which makes the above argument valid is that each capacitor's leads are completely independent. Leads (201.1) and (202.1) tie to main lead (204.1) at separate connection points. Leads (201.2) and (202.2) tie to separate, independent ground lugs (207) and (208). Thus, there is no one component or wire that can break that will not leave at least one of the capacitors still connected.

Finally, UHF connector (209) connects to a 2-conductor, shielded cable which carriers the voltage to the apparatus. Both the low side of the circuit and the shield connect to the shell of the UHF connector (ground). If the capacitance tap adaptor is to be left in place for a while and not connected to the apparatus, a shorted UHF plug can be connected, shorting the capacitance tap to ground as in normal operations, and also protecting the UHF connector.

It is suggested that perhaps a still more desirable embodiment of the capacitance tap adaptor would be a design which permitted it to be screwed into the capacitance tap without having to first connect to the center pin. All connections would be made automatically, with a spring clip making the center pin connection as on the capacitance tap cap supplied by the equipment manufacturer. It is envisioned that just such a design may be utilized in our future planned development of the instant invention.

Figure 3:
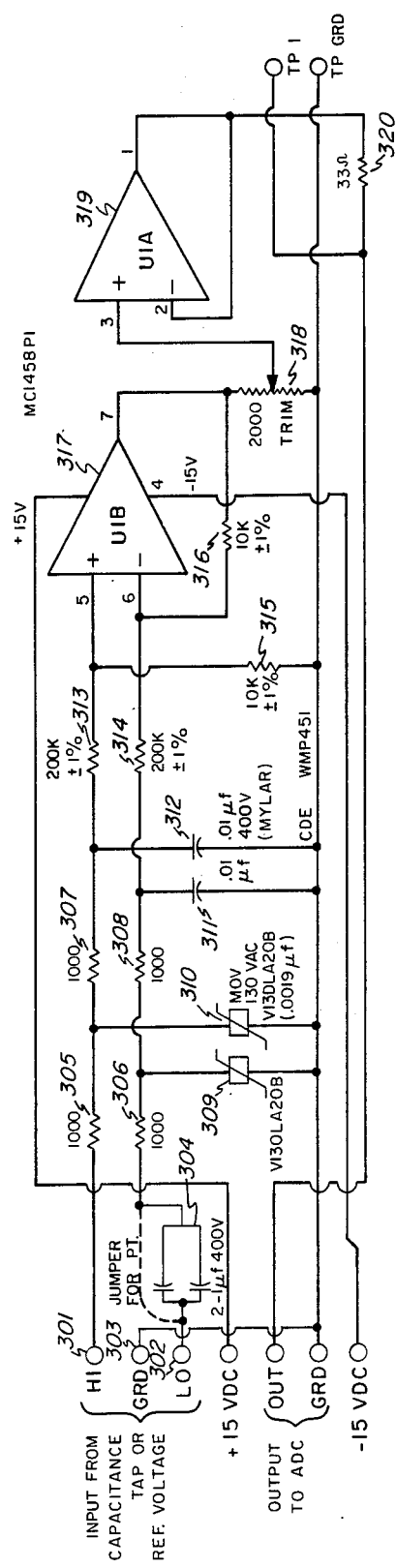
FIG. 3 illustrates by means of a schematic diagram the voltage interface attenuator/amplifiers.

Referring now more specifically to FIG. 3 it will be seen that shown therein is an example of a voltage interface amplifier utilized in the present invention. It should be noted that this particular circuit is used in the second embodiment of our invention, but that the first embodiment thereof employs a very similar circuit (see for example FIG. 4 infra). This circuit was designed for compatibility with the capacitance tap adaptor (FIG. 2 supra) used with TVA current transformers, and also with the computer used in the second embodiment (see FIG. 7 infra). As noted above the circuit parameters would be different in other applications.

Referring now more specifically to FIG. 3, it will be seen that the high side, low side, and shield wires of the cable from the capacitance tap adaptor connect to terminals (301, 302, and 303), respectively. Capacitors (304) are paralleled to make a single 2 microfarad, 400 volt capacitor, but a single 2 microfarad, 200 volt capacitor can be used if available. This capacitor completes the reactive differential balance of the amplifier, since the high side comes from a 2 microfarad capacitive shunt in the capacitance tap adaptor. The low side, on the other hand, is grounded directly at the capacitance tap adaptor. We have found that capacitors (304) can be omitted with very little degradation of performance.

Resistors (305 and 306), with varistors (309 and 310), form a protective transient suppressor circuit. Since the varistors also have inherent capacitance, this suppressor circuit combines with resistros (307 and 308) and capacitors (311 and 312) to form a two-pole, low-pass filter, with a gradual rolloff which is 3 dB down at about 8 kHZ. This filter suppresses high frequency interference while causing a phase shift at 60 Hz of only about 0.5 degrees.

Resistors (313, 314, 315, and 316), along with U1B (317), make up a differential amplifier with an attenuation factor of 20:1 (26 dB of voltage loss). The large voltage reduction allows the circuit to work properly with an input voltage of up to 150 volts RMS. Trimpot (318) sets the output voltage to the value required by the control unit, which is nominally about 2.8 volts RMS. U1A (319) serves as a buffer and impedance amplifier. Resistor (320) ensures stability of U1A.

The differential amplifier, while not an absolute necessity, is very effective in reducing interference from nearby high current conductors. Such interference can create considerable error on a long cable run, and cannot always be reduced sufficiently by shielding alone. The combination of the differential amplifier and the shield, which is grounded solidly at both ends, eliminates virtually all 60 Hz interference.

The values of resistors (313, 314, 315, and 316) can be changed to accommodate different input and output requirements. The attenuation of the circuit is determined by the ratio of (313) divided by (315) or the ratio of (314) divided by (316). These ratios must be equal for differential balance.

This same circuit is used to interface with the reference voltage. The reference voltage is usually taken from either a magnetic voltage transformer or a tuned capacitive potential device. In either case, the voltage input to the circuit is usually either 67 or 120 volts RMS, with which the circuit is fully compatible. Capacitors (304) are bypassed when used on the reference voltage.

Any difference in phase shift between the capacitance tap amplifier and the reference voltage amplifier must be calibrated out of the system. This is accomplished by applying the same voltage to both circuits, with the voltage to the capacitance tap circuit being applied through a capacitance equal to the total of the capacitance tap, the capacitance tap adaptor, and the cable. The apparatus is set to read zero ( or the capacitance tap adaptor dissipation) with this voltage applied as described.

Figure 4:
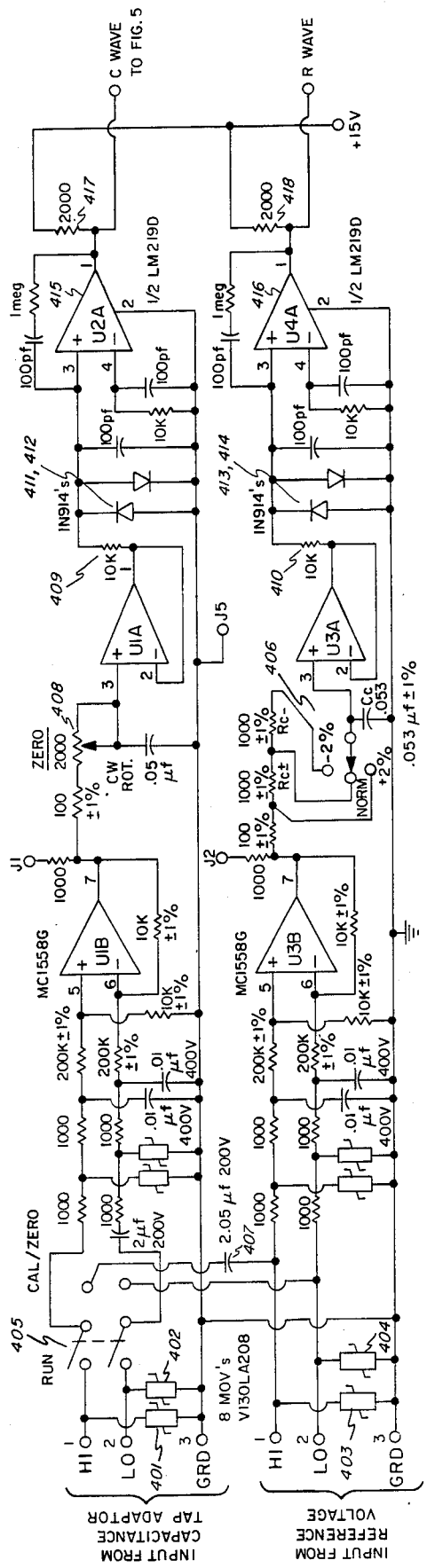
FIG. 4 illustrates by means of a schematic diagram the input analog circuits used in the first embodiment.
Figure 5:
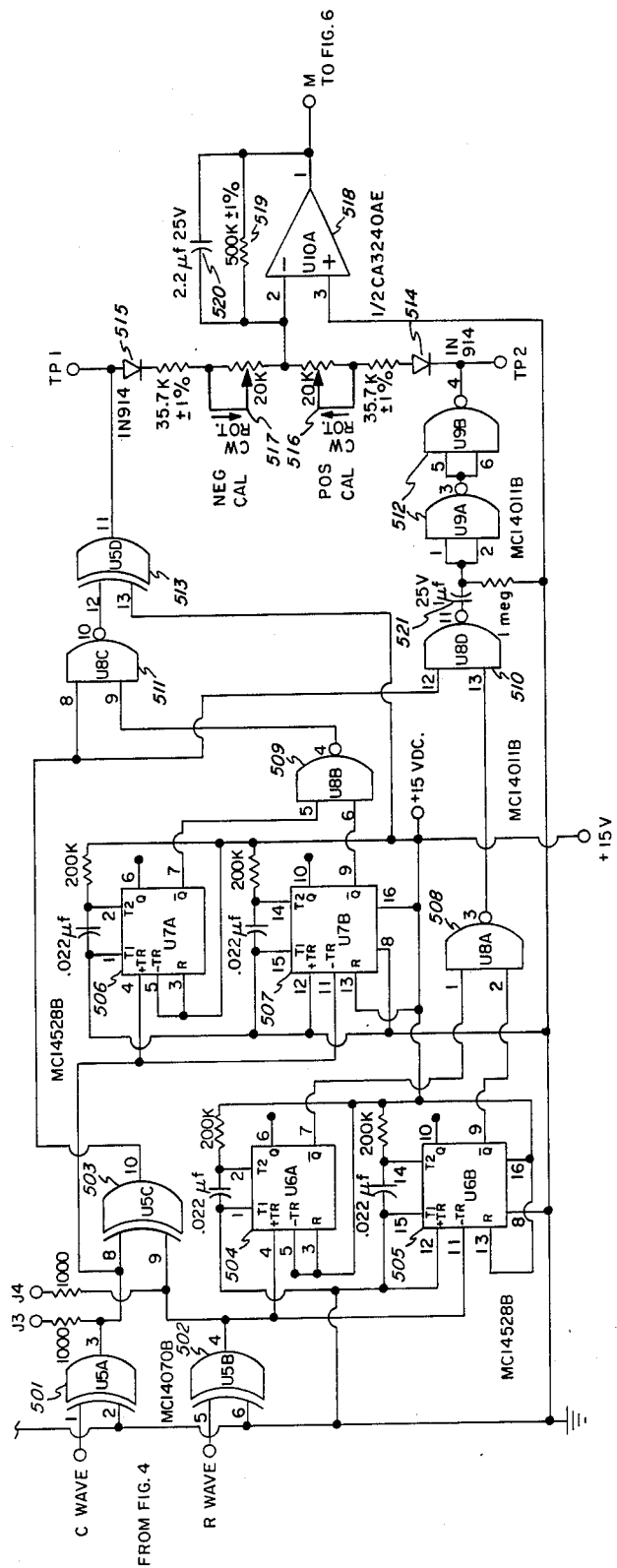
FIG. 5 illustrates by means of a schematic diagram the digital timing circuits used in the first embodiment.
Figure 6:
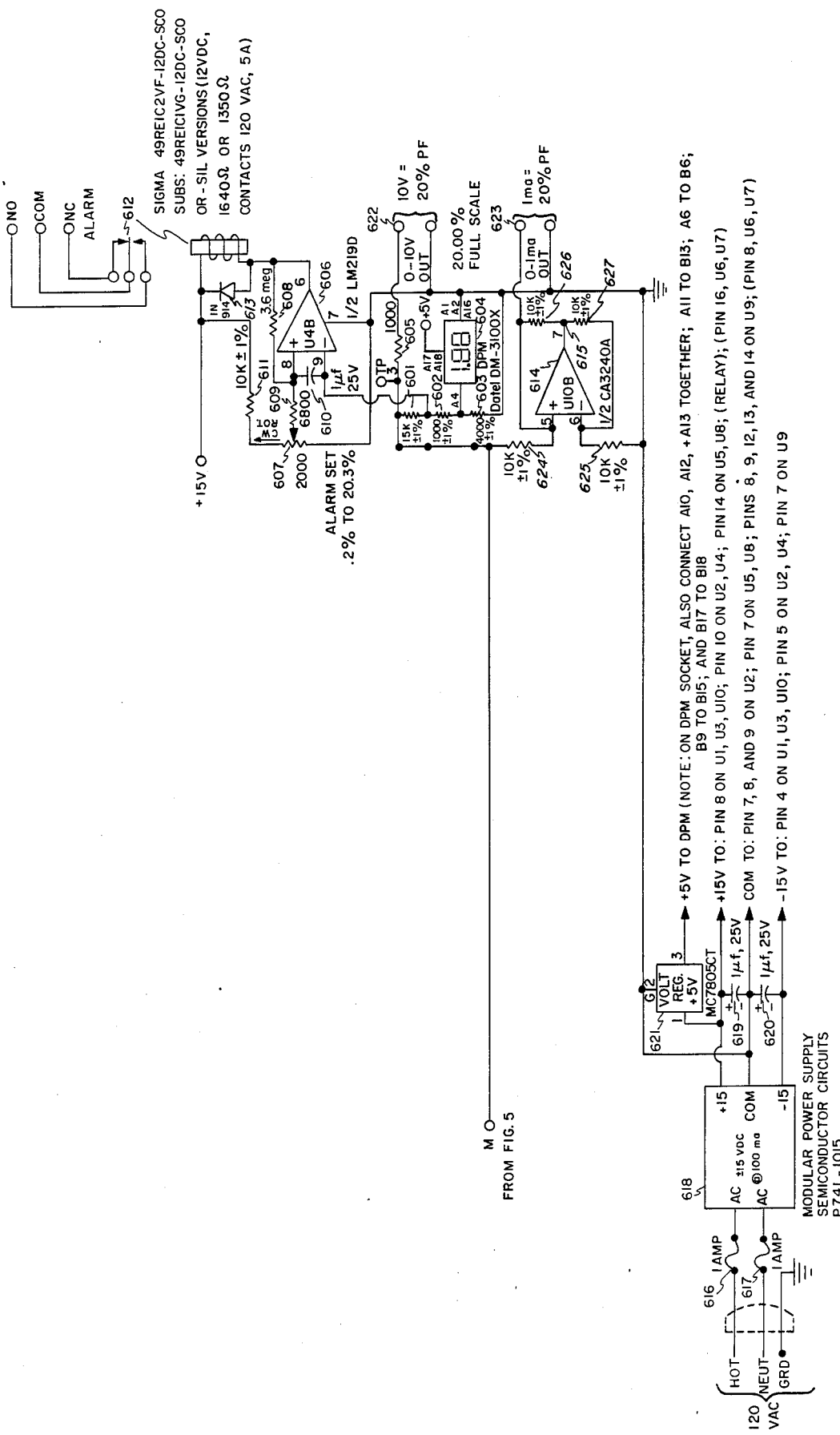
FIG. 6 illustrates by means of a schematic diagram the metering, output, and power supply circuits used in the first embodiment.

The next three illustrations, to wit FIGS. 4, 5, and 6 will be referred to as a group in that they related to the first embodiment of the apparatus, which contains both analog and digital circuits, but no computer.

Referring now more specifically to FIG. 4, it will be noticed that the input circuitry looks very much like that of the voltage interface amplifier just described in our treatment of FIG. 3, supra. Varistors (401, 402, 403, and 404) provide additional transient protection, and are particularly useful to protect calibration switch (405). Unlike the computerized second embodiment of the instant invention, this first embodiment thereof should be calibrated and zero checked at regular intervals. Switches (405 and 406) allow this calibration operation to be performed at any time. Switch (405) connects both channels to the reference voltage, with capacitor (407) simulating the capacitance tap adaptor. With switch (406) in the NORM position, the output is adjusted to zero with ZERO potentiometer (408). Calibration can then be checked at plus 2 percent power factor and minus 2 percent power factor by setting switch (406) appropriately.

The operation of the transient suppressor circuits, filters, and differential attenuator/amplifiers are the same as described for FIG. 3 supra. There is, however, no output voltage control because this embodiment does not monitor capacitance, but only phase angle, making the amplitude of the waves unimportant.

Resistors (409 and 410) and diodes (411, 412, 413, and 414) clip the waveforms symmetrically and protect voltage comparators U2A (415) and U4A (416). The waveforms are converted to true square waves, with transitions at zero and 180 degrees of the original waves, by U2A (415) and U4A (416). Resistors (417 and 418) serve as "pull-up" resistors for U2A and U4A, which have open collector transistor outputs.

Referring now more specifically to FIG. 5, it will be appreciated that both EXCLUSIVE OR gate U5A (501) and EXCLUSIVE OR gate U5B (502) serve as noninverting buffers to make the waveforms fully compatible with the remaining CMOS circuitry. EXCLUSIVE OR gate U5C (503) has a high (positive) output whenever the C and R waveforms are opposite (one high and the other low), and a low (zero) output when they are the same (both high or both low). Thus, if the waves are exactly in phase and have the same symmetry, EXCLUSIVE OR gate U5C always has a low output except for perhaps some extremely fast "glitches" at the transition points. If the waves are slightly out of phase, the output of U5C will be a string of short pulses, with the length and position of the pulses being the same as the time between the zero crossings of the two waves. No distinction has yet been made concerning which wave leads. Positive pulses are generated at both positive and negative zero crossings, so the repetition rate is twice the line frequency.

Monostable multivibrators U6A, U6B, U7A, and U7B (504–507, respectively) help determine which wave is leading, so that the appropriate pulses can be passed through to charge storage capacitor (520) to the correct polarity. The inappropriate pulses are blocked.

All the monostable multivibrators have timing networks (200,000 ohms and 0.022 microfarad) which provide output pulses of about 2.4 milliseconds, much longer than the 0.53 millisecond pulse length necessary to give a full scale (20 percent) power factor reading. Multivibrator U6A (504) is triggered by the positive going zero crossing of the R (reference) wave and multivibrator U6B (505) by the negative going zero crossing of the same R wave. NAND gate U8A (508) takes its input from the NOT Q outputs of multivibrators U6A and U6B, so the output of NAND gate U8A is low most of the time; it goes high, however, for 2.4 milliseconds starting at each zero crossing (positive or negative) of the R wave. If the R wave is leading the C wave, as it should for a positive power factor, then the pulse generated by EXCLUSIVE OR gate U5C (503) at each zero crossing occurs during the 2.4 millisecond pulse generated by U8A. The two pulses drive the output of NAND gate U8D (510) for a time equal to the shorter of the two pulses. If the C wave is leading the R wave, then the pulse generated by U5C occurs before the 2.4 millisecond pulse, and U8D is not driven low. The net result is a negative going pulse at the U8D output when, and only when, any zero crossing of the R wave occurs before that of the C wave. An additional requirement is that the waves be within 90 degrees of each other.

The pulses from U8D go from plus 15 volts to zero volts. These are coupled through capacitor (521) to U9 (512), which is a two-stage, noninverting buffer operating between minus 15 volts and zero volts. Thus, pulses delivered to TP2 and diode (514) are negative going from zero to minus 15 volts. U10A (518) is an inverting, zero impedance (current summing) amplifier, so the negative pulses charge storage capacitor (520) such as to fdrive the output of U10A (point M) positive.

U5C (503), U7A (506), U7B (507), U8B (509), and U8C (511) operate in an identical manner to that described above to produce negative going pulses at the output of NAND gate U8C when, and only when, any zero crossing of the C wave occurs before that of the R wave. These pulses are inverted by EXCLUSIVE OR gate U5D (513), and pass through diode (515) to charge the storage capacitor (520) such as to produce a negative output at point M.

Trimpots (516 and 517) adjust the pulse current for calibration of the circuit. Resistor (519) is selected so that when the trimpots are properly set, a 0.2 radian phase difference produces a voltage of 10 volts at point M.

This circuit reads both positive and negative power factor. Though negative power factor cannot actually occur in insulation, the circuit must still respond to it, because alternate or random pulses of opposite polarity can occur due to waveform distortion, dissymmetry, or noise. Pulses of both polarities must be properly averaged together for accuracy near zero power factor.

Referring now more specifically to FIG. 6, it will be seen that the voltage developed at point M (as described with FIG. 5 supra, 10 volts dc positive for full scale power factor of 20 percent) is passed through resistor (605) to the 10 volt output (622). It is also applied to a current pump composed of operational amplifier U10B (614) and the associated 10,000 ohm resistance bridge (624, 625, 626, and 627). The current pump supplies up to 1 ma to the current output (623), which is independent of the external resistance up to the voltage compliance limit. The output (615) of (current summing) amplifier U10B must always be twice the voltage at the current output terminal (623). Since the voltage at (615) is limited to about 12 volts, the voltage at (623) is limited to 6 volts. Thus, the maximum load resistance is 6,000 ohms if full scale current of 1 milliamp is to be delivered.

One side is grounded on both the voltage and current outputs, so floating or differential loads are not required.

The voltage at point M is also passed to a voltage divider composed of resistors (601, 602, and 603). Twenty percent of the voltage is passed to digital panel meter (604), which is set for 2 volts full scale. The digital panel meter has 3½ digits, and the decimal point is fixed so that a full scale indication of 19.99 is provided.

The same voltage divider passes 25 percent of the voltage at point M to comparator U4B (606), which drives alarm relay (612). Diode (613) protects the output transistor of U4B from transients caused by the inductive relay coil. The level that trips relay (612) is set by potentiometer (607). It and resistor (611) comprise a voltage divider between plus 15 volts dc and ground. Hysteresis and positive feedback are provided by resistors 608 and 609, assuring that the relay picks up completely with a minimum of chatter. The amount of hysteresis is about 1.5 percent of full scale or about 0.3 percent power factor. If the power factor decreases to 0.3 percent below the alarm set point, the alarm resets. Capacitor (610) guards against the alarm being set off by noise or a transient.

For better alarm setting accuracy, a switch with precision resistors can be substituted for potentiometer (607).

All circuits are powered by dual 15 volt dc power supply (618). Fuses (616 and 617) protect against short circuits. Capacitors (619 and 620) are located on the circuit board and assure a low source impedance at high frequencies. Voltage regulator (621) supplies the digital panel meter. All operational amplifiers and voltage comparators require plus 15 volts and minus 15 volts. All digital integrated circuits require plus 15 volts and common (ground) except U9 (512, FIG. 5 supra) which requires minus 15 volts and common.

The following illustrations, to wit, FIGS. 7-9 and 11 are directed to the second embodiment of the present invention and the one that we feel is the best version of the apparatus because it is more easily expandable and provides more information than the first embodiment. FIG. 10 is directed to an interface circuit used in the instance of a hydrogen probe.

The capacitance tap adaptors are identical in the two embodiments, and the voltage interface attenuator/amplifiers are similar. Other components are different, however, with the main difference being the control unit. A Motorola VME microcomputer system, based on the MC 68000 microprocessor, is at the heart of the control unit in the second embodiment. Other computers may be used in the future as the state of the art changes.

Figure 7:
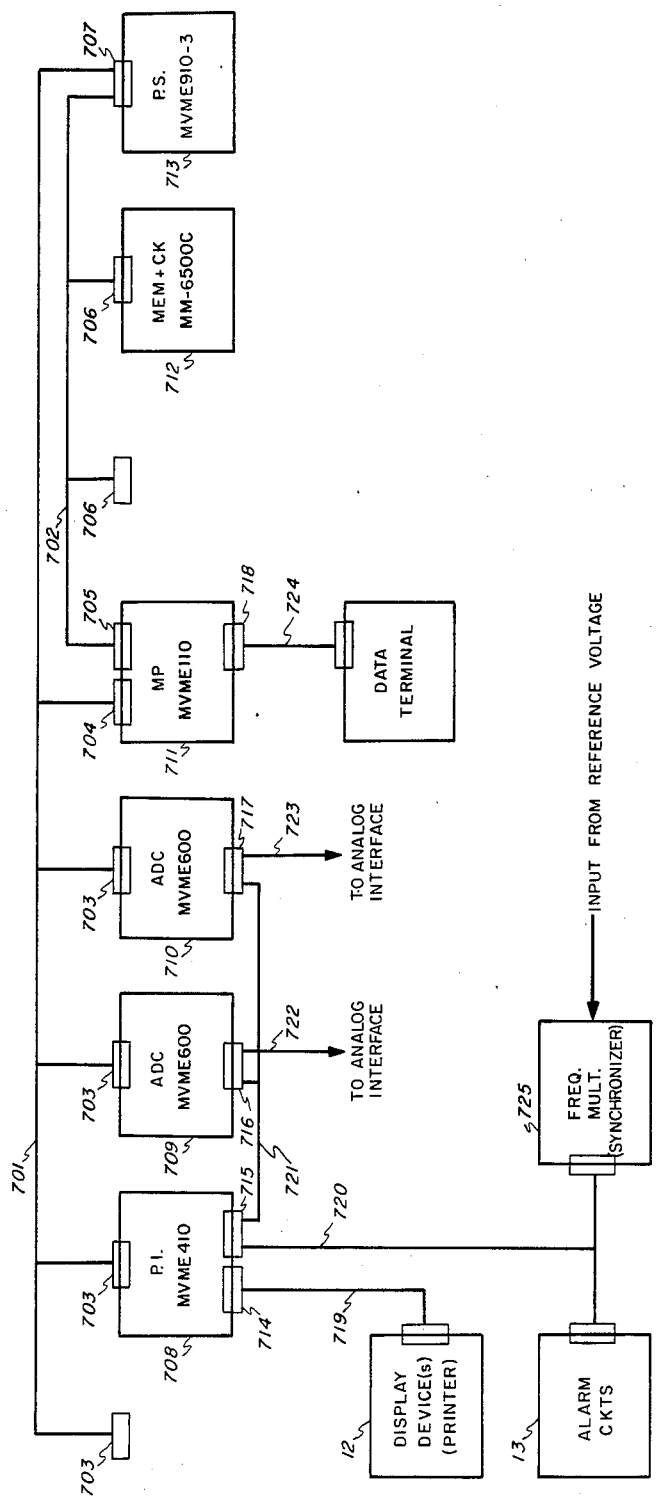
FIG. 7 diagrammatically illustrates the computer equipment used in the second embodiment of the instant invention.

Referring now more specifically to FIG. 7 therein is shown a diagram of the VME computer system with the peripherals used in said second embodiment. The computer equipment includes a monoboard microcomputer module (711), ADC modules (709) and (710), parallel interface module (708), battery backed random access memory and realtime clock (712), and power supply module (713). Multiconductor bus (701) is provided to connect modules (708), (709), and (710) to microcomputer module (711) and to power supply module (713). Multiconductor bus (702) is provided to connect microcomputer module (711) to battery backed memory and realtime clock module (712). Bus (701) and bus (702) have provisions for connections to additional modules.

Connector (714) and multiconductor cable (719) are provided to connect parallel interface module (708) to printer 12. Connector (715) and multiconductor cable (720) are provided to connect parallel interface module (708) to alarm circuits 13 and to synchronizer circuits (725). Connector (715) and cable (721) are used to connect parallel interface module (708) to ADC modules (709) and (710). The connection through cable (721) is used to provide simultaneous sampling and analog-to-digital conversion of an analog input to module (709) and an analog input to module (710). Connector (716) and multiconductor cable (722) are provided to couple analog voltages to ADC module (709). Connector (717) and multiconductor cable (723) are provided to couple analog voltages to ADC module (710). Connector (718)

and multiconductor cable (724) are provided to connect monoboard microcomputer module (711) to a data terminal. The data terminal may be used to allow manual control of certain functions and to allow modification of certain variables.

Figure 8:
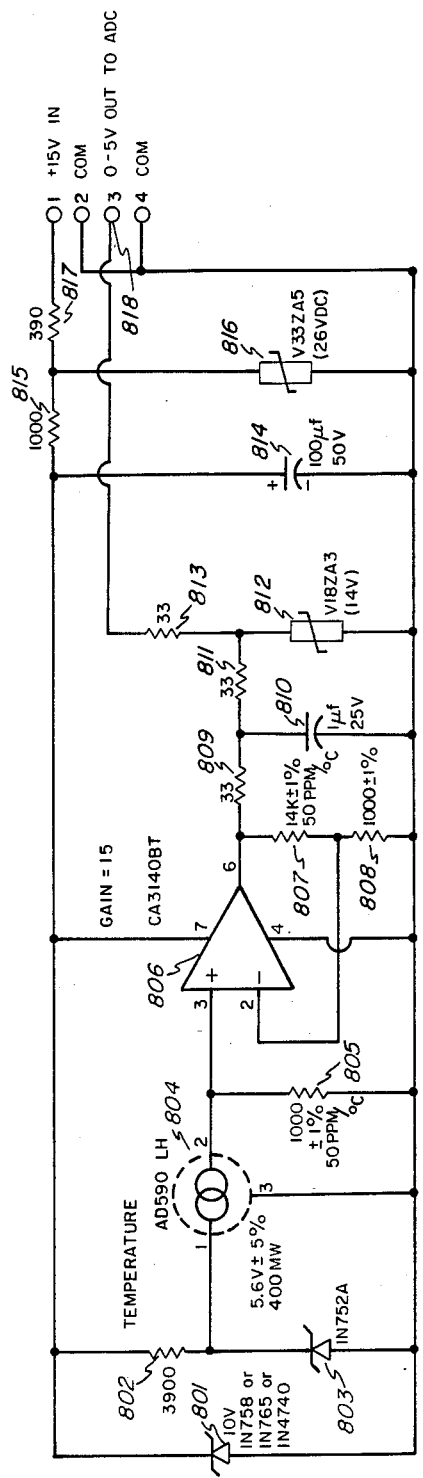
FIG. 8 illustrates by means of a schematic diagram the temperature measuring circuit used in the second embodiment.

Referring now more specifically to FIG. 8 therein is shown an example of the ambient temperature probe used with the second embodiment of the apparatus of the present invention. A similar circuit can be used with our first embodiment if an additional readout device is provided. The circuit shown in FIG. 8 feeds into the control unit computer through an ADC.

As shown in FIG. 8, a positive 15 volts is fed through resistors (817 and 815), which drop the voltage to about 10 volts as determined by zener diode (801). Resistors (817 and 815), with varistor (816) and capacitor (814), provide transient protection and filtering.

The 10 volts developed across zener diode (801) is applied through resistor (802) to zener diode (803), which develops a voltage of about 5 volts to ground. This 5 volts is applied to a two (active) terminal temperature sensor (804), the current through which is proportional to absolute temperature (1 microamp per degree Kelvin). This current passes through resistor (805), which develops a voltage of 1 millivolt per degree Kelvin (about 0.3 volt at room temperature). This voltage is amplified by operational amplifier (806), the gain of which is set at 15 by resistors (807 and 808). The amplified voltage passes through a transient protection circuit and low-pass filter composed of resistors (809, 811, and 813), along with capacitor (810) and varistor (812), to the output (818).

The active range of this temperature probe is 0° F. to 140° F., corresponding to a voltage output of 3.8 to 5.0 volts. The large common-mode voltage is subtracted digitally, rather than using a drift-prone analog circuit. The temperature sensor (804) is mounted snugly, with epoxy, into a hole in the probe case, so that the probe becomes a heat sink which assumes ambient temperature. This construction provides "peak filtering," with a time constant of about 15 minutes. The probe is filled with a potting compound for waterproofing. The entire probe is calibrated over the active temperature range, and appropriate constants are stored in the computer. Sufficient accuracy could probably be attained by calibrating only at room temperature, however.

An alternative temperature measuring scheme which has also been used in our investigations involves utilizing the digital binary coded decimal (BCD) output of a commerical digital thermometer. The BCD output is interfaced through an input/output (IO) port on the computer.

Figure 9:
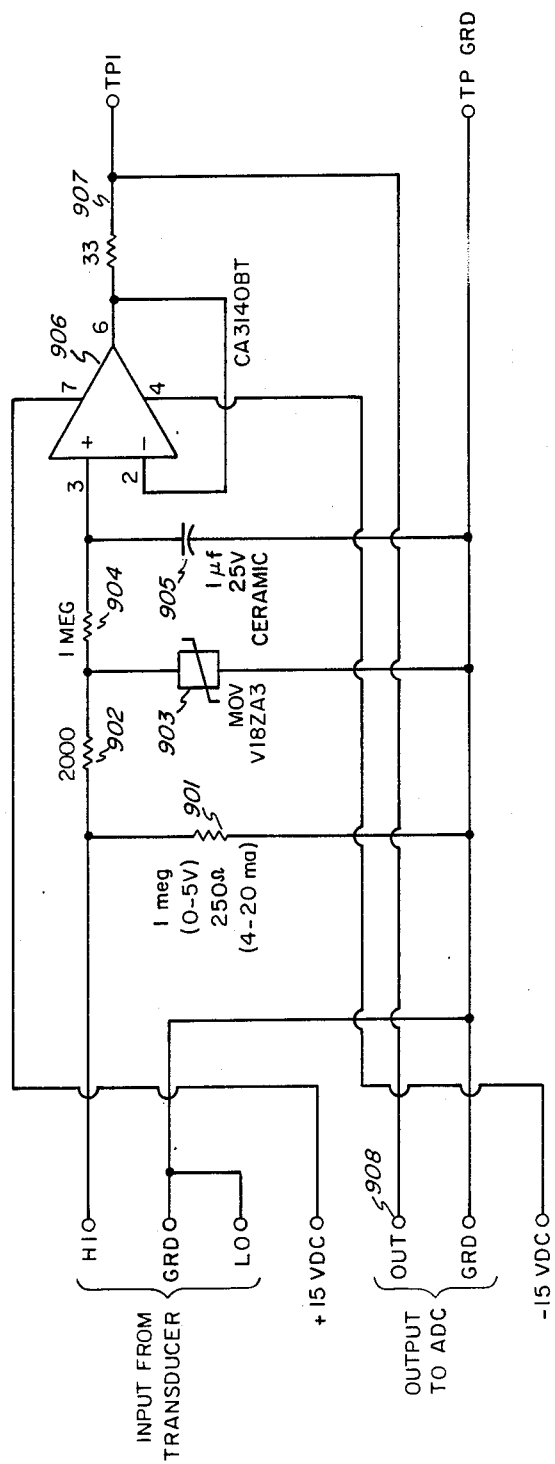
FIG. 9 illustrates by means of a schematic diagram the transducer interface amplifier circuit used in the second embodiment.
Figure 10:
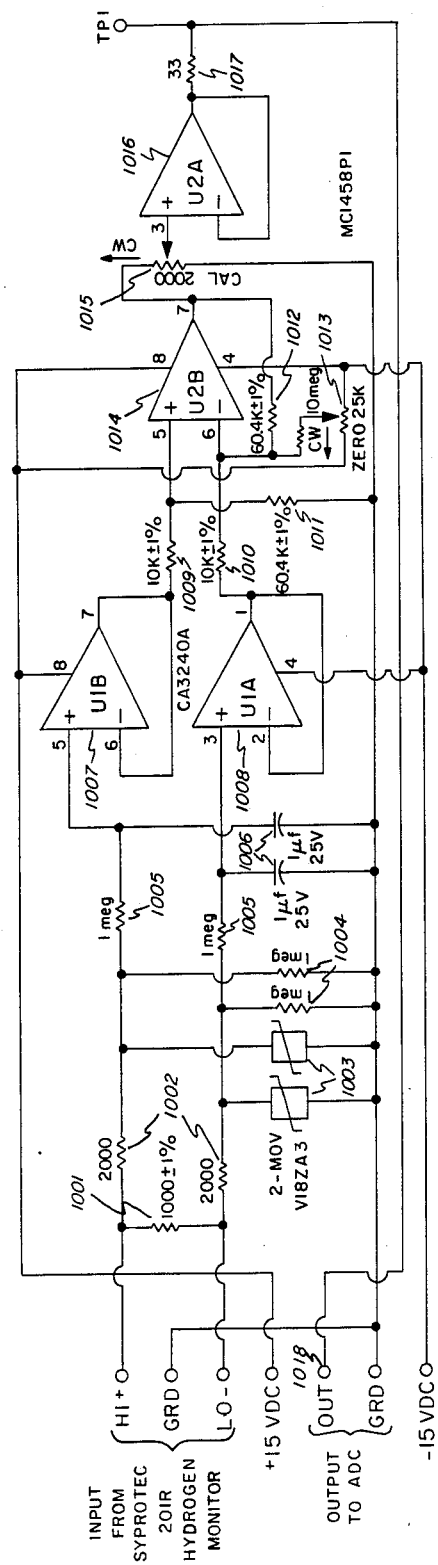
FIG. 10 illustrates by means of a schematic diagram the interface circuit used for optical monitoring of dissolved hydrogen in the second embodiment.

Referring now more specifically to FIG. 9 therein is shown an example of a transducer interface amplifier used for monitoring temperature, pressure, or any other quantity from a transducer with 0-to-5 volt or 4-to-20 ma dc output. The amplifier has unity gain, with no provision for zero or offset null, which, if needed, is done in other places.

The value of resistor (901) depends on the transducer output. For a 4-to-20 milliamp transducer, the value is 250 ohms, so that 1-to-5 volts is passed to operational amplifier (906). On a 0-to-5 volt transducer, the value of resistor (901) is 1 megohm, which serves only to hold the output (908) near zero volts when there is no input connection.

Resistors (902 and 904), varistor (903), and capacitor (905) provide transient protection. Resistor (904) and capacitor (905) also form a one-pole, low-pass filter with a 3 dB cutoff frequency of 0.16 Hz. Operational amplifier (906) has a field effect transistor input, so its input impedance is much higher than the 1 megohm filter impedance. Operational amplifier (906) is connected for unity gain, so the 1-to-5 or 0-to-5 volts across resistor (901), after being filtered, appears at the output (908). Resistor (907) assures stability of the operational amplifier (906).

The transducer power supply may be located in the control unit or at the transducer. It should be run on separate wires if a 0-to-5 volt transducer is used.

Referring now more specifically to FIG. 10 therein is shown an example of an interface circuit used for logging dissolved hydrogen in the oil of an oil and paper bushing or instrument transformer. It is designed to convert the output of a Syprotec 201R hydrogen monitor (0-to-1 ma) to a computer-compatible 0-to-5 volts dc. The 1 ma output of the hydrogen monitor is off ground, intended for use with an isolated, ungrounded strip-chart recorder. Therefore, a dc differential amplifier was needed.

As shown in FIG. 10, resistor (1001) is a precision resistor which develops a voltage of 0-to-1 volt for a 0-to-1 milliamp signal. This 0-to-1 volt differential signal is passed, along with the common-mode voltage, through unity-gain operational amplifiers U1B (1007) and U1A (1008) to the differential amplifier circuit, operational amplifier (1014) and associated circuitry. As described for FIG. 9, resistors (1002 and 1005), varistors (1003), and capacitors (1006) provide transient protection and filtering. Resistors (1004) hold the output (1018) to near zero volts when there is no input connection. Unity-gain operational amplifiers U1B (1007) and U1A (1008) provide current gain, transforming the 1 megohm filter circuits to less than 100 ohms as required by the differential amplifier.

The differential amplifier is composed of operational amplifier U2B (1014) and resistor (1009, 1010, 1011, and 1012). It has a voltage gain of 6 to differential signals and less than 0.1 to common-mode voltages. Thus the desired hydrogen information is amplified and the common-mode voltage is stripped off. Potentiometer (1013) can be used to zero the circuit and offset the hydrogen monitor's zero error, if any.

The 0-to-6 volts from the differential amplifier is reduced to 0-to-5 volts by potentiometer (1015), so as to be compatible with the computer. Unity-gain operational amplifier U2A (1016) reduces output impedance, and is assured of stable operation by resistor (1017).

Figure 11:
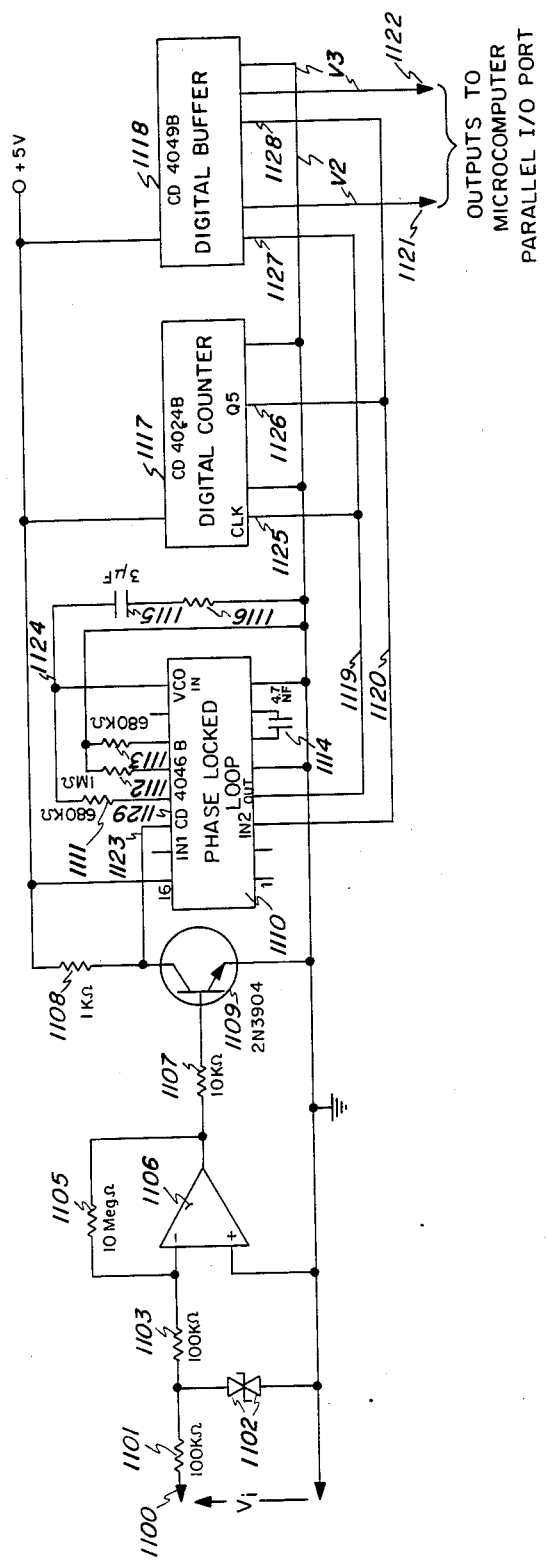
FIG. 11 illstrates by means of a schematic diagram the frequency multiplier used in the second embodiment.

Referring now more specifically to FIG. 11 therein is shown the synchronized frequency multiplier circuit used in the second embodiment of the instant invention to provide timing pulses for the ADC. It uses a CMOS phase-locked loop, CD4046B, which has a phase comparator (phase comparator II) that allows phase lock between two waves without allowing any phase difference between them.

As shown in FIG. 11, the input (1100) is usually taken from the voltage reference source, and is usually either 67 or 120 volts ac. Resistor (1101) and two back-to-back zener diodes (1102) limit the voltage and protect voltage comparator (1106), which with resistors (1103 and 1105), further squares up the waveform. Transistor (1109), with resistors (1107 and 1108), converts the wave to a 0-to-5 volt square wave compatible with that needed by the phase-locked loop (1110). Transistor (1109) operates either fully on (saturated) or fully cut off.

For the phase-locked loop (1110) to operate as a frequency multiplier, its voltage controlled oscillator (VCO) must operate at the desired high frequency. Since the input frequency of 60 Hz is to be multiplied by 32, the VCO operates at 1920 Hz. Resistors (1112 and 1113) and capacitor (1114) set a frequency range to include 1920 Hz. Since the signal input to phase comparator (1123) is 60 Hz, the VCO output (1119) of 1920 Hz is divided by exactly 32 by counter (1117). The counter output (1126) of 60 Hz goes to the other phase comparator input (1120). The phase comparator output (1129), which is the frequency/phase error signal, is filtered by resistors (1111 and 1116) and capacitor (1115), which are selected to provide good VCO stability consistent with good locking characteristics. The VCO input (1124) fine tunes the VCO frequency to attain and hold frequency and phase lock with the input signal (1100, 1123).

Buffer (1118) passes the 1920 Hz square wave to output (1121) and the 60 Hz square wave to output (1122). The waves are precisely synchronous with each other and tightly locked to and in phase with the input wave. By using these waves to control the ADC, exactly 32 voltage samples can be taken of each cycle of each input wave, or one sample every 11.25 degrees.

Figure 12:
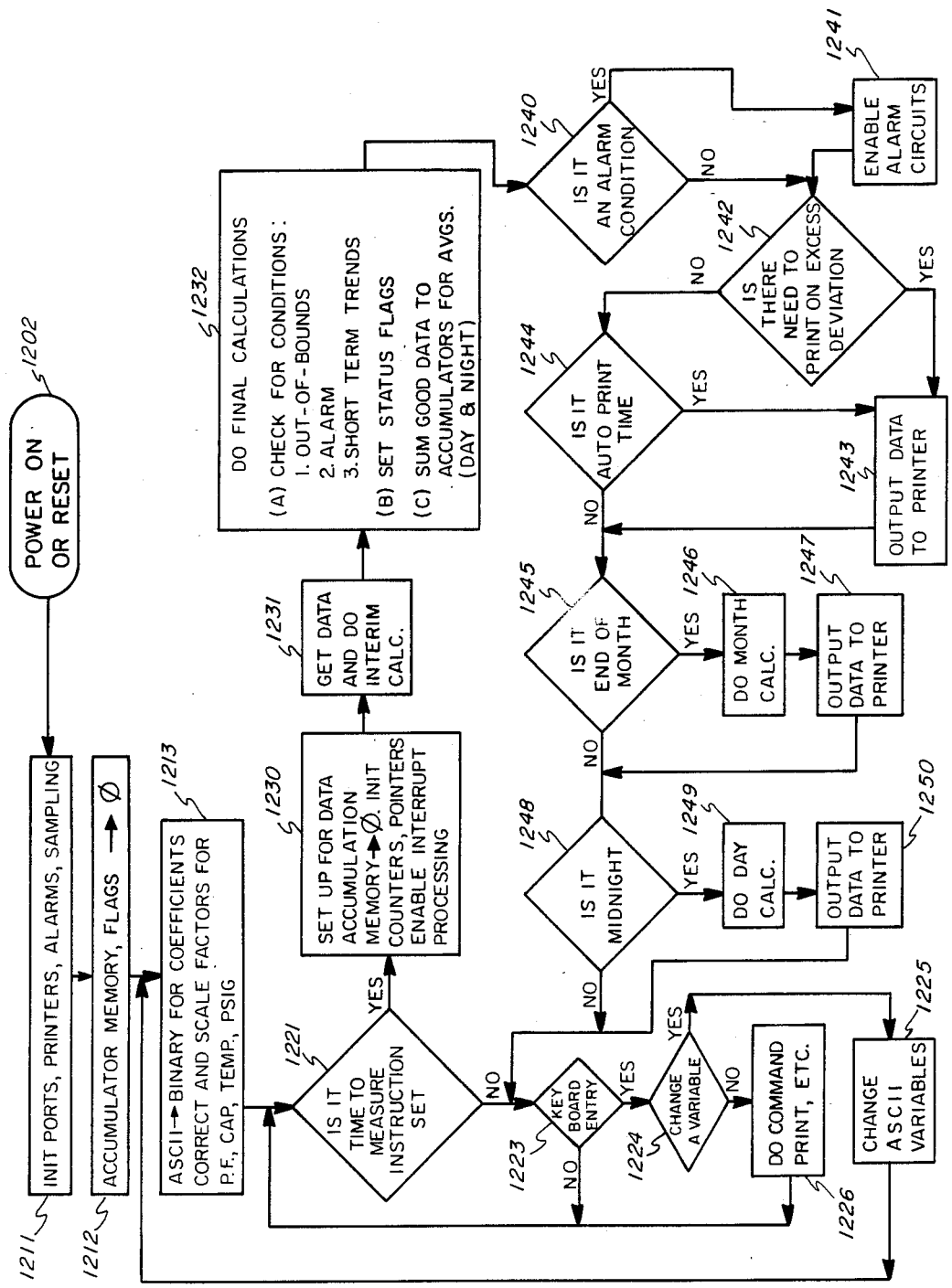
FIG. 12 illustrates by means of a program logic flow chart the method and/or technique utilized in the second embodiment of the instant invention.

Referring now more specifically to FIG. 12 therein is illustrated by means of a computer program logic flow chart the method and/or technique utilized in the second embodiment of the instant invention. In FIG. 12, the computer function steps are indicated within rectangles with the stop/start steps indicated within ovals. The logic steps or questions are shown within diamond-shaped parallelograms. After power on or reset to initialize, the program (1202) goes to the startup routine beginning with the initialization of peripheral ports for printers, terminals, alarms, and analog sampling control interrupts (1211), and then sequences to clear to zero all accumulator memory used for summations and clear status and control flags (1212). The next function step comprises computing correction factors for percent power factor and capacitance computations, as well as determining correction factors which are functions of the electrical parameters of the interface network that are determined by calibration and stored in nonvolatile memory and computing scale factors and coefficients for conversion of other analog inputs—temperature, pressure, etc.—to desired units (1213).

The program then sequences to the wait-for-event routine beginning with the check time instruction (1221) wherein the computer asks if it is time for measurement. If yes, it follows the action instruction set, which directs that, subsequent to the determination of measurements and computations, it check results of computations and determines action to be taken; i.e., alarm, print record, daily averages, monthly averages, etc. and goes to the measure subroutine beginning at (1230). If no, it skips the action instruction set at (1221) and proceeds to keyboard entry instructions (1223) whereupon it checks for operator entries such as system parameters entered manually by the computer control operator through a control console or terminal and if yes, performs the required task such as updating variables, (1225), which are returned to computing correction factors function step (1213) or it performs the required task such as listing variables, listing command tables, printing record(s), etc. (1226). If there are no keyboard instructions, it returns to check time instruction set (1221).

When check time instruction (1221) is yes, the program goes to the measure subroutine beginning at (1230) where it sets up for data accumulation, clears memory, initializes counters and pointers, enables interrupt processing, and sets up arrays for data accumulation. In the next shown function step (1231) the program begins analog-to-digital conversion and accumulation of data, performs intermediate calculations and continues same until all samples for the measurement interval are obtained. The program next directs at (1232) the computer to determine the final results, i.e., percent power factor, capacitance, temperatures, and other desired results including computed internal temperature and temperature corrected percent power factor. Subsequently, the program checks for alarm conditions (1240) and if yes, enables alarm circuits (1241), if no, it checks for results outside specified bounds (1242); and, if yes, outputs data to printer (1243), if no, it checks for time to print (1244). If time to print is yes, it outputs data to printer (1243); if no, then it checks time for end of month averaging (1245). If time for end of month averaging is yes, it retrieves summed good data from accumulators (1232), does calculating (1246), and outputs data to printer (1247). If not end of month, then it checks for midnight (i.e., time for end of day) averaging (1248). If yes, it retrieves summed good data from accumulators (1232), does calculating (1249) and output data to printer (1250). If no, it returns to action instruction set at (1221) of wait-for-event routine.

Although the measure subroutine has been described in its relationship to the operation of this program in this discussion of FIG. 12, it will, of course, be appreciated that there are other major subroutines herein involved. For a more detailed description of same see the "General Microcomputer Software Description" set forth infra, after a description of "Embodiment Two" of "The Preferred Embodiments" section.

Briefly, some of these other major (and minor) subroutines comprise:
1. Percent Power Factor and Capacitance Computation
   a. Data Accumulation
   b. Accumulated Data Format
   c. RMS Computation—Current and Voltage
   d. Watts Computation
   e. Final Computations
2. Computation of Temperatures, Pressures, Hydrogen, etc.
3. Alarm Analysis
4. Trend Analysis
5. Daily and Monthly Averages
6. Compute Estimate of the Internal Temperature of Monitored Equipment
7. Other (minor) Subroutines Used
   a. Square Root
   b. Binary to Decimal Conversion
   c. Decimal to ASCII Conversion
   d. ASCII to Decimal Conversion
   e. Decimal to Binary Conversion
   f. Double Precision Multiply
   g. Double Precision Addition
   h. Extended Divide

DESCRIPTION OF THE PREFERRED EMBODIMENTS

As indicated supra, the instant invention is described both in toto, and in two separate embodiments thereof, which two embodiments are as follows.

EMBODIMENT ONE

Normally the equipment being monitored by the apparatus in this first embodiment of the instant invention is either a high voltage bushing or an instrument transformer with a capacitance tap bringing out the connection between the primary insulation and the bottom layer of insulation, which is shorted out whenever the capacitance tap is grounded. Ideally, the capacitance of the primary insulation is "pure" with no dielectric losses. In practice, there will be some loss, which can be represented by a resistance in parallel with the primary insulation. If the loss is high enough (represented by a relatively low resistance value), significant heating will occur in the insulation. This heating is proportional to the watts loss. Note that this resistance is an equivalent resistance (rather than an actual physical resistor) which is inconvenient to measure. The watts loss can also be determined from the capacitance, voltage, and power factor of the primary insulation, as follows $$PF = COS(A)$$

$$C \simeq I/(2\pi f v)$$

$$W = VI \, COS(A)$$

$$W \simeq 2\pi f C V^2 COS(A) \text{ or } W \simeq 2\pi f C V^2 (PF)$$

where PF is the insulation power factor, C is the capacitance of the primary insulation, I is the insulation current, A is the phase angle that V lags I, and f is system frequency. Since V and f are known to a reasonable degree of accuracy, and PF and C are measured by the apparatus being patented, the watts loss can be determined. (Actually, in most instances, the capacitance of the primary insulation is also known, and need not be measured, except that it also can give an indication of insulation quality.)

The watts loss of the insulation is very significant because the temperature rise inside the insulation is directly proportional to this loss. High temperature causes further deterioration of the insulation, which causes even higher loss, and so on, until the equipment eventually fails.

In practice, the power factor itself is more useful than watts loss. At any rate, the apparatus of the instant invention, while accurately monitoring the true power factor, primarily looks for increases in power factor beyond what can be expected because of temperature fluctuation.

The capacitance tap is connected to ground through a capacitive shunt that is virtually lossless and is contained in a specially designed and constructed capacitance tap adapter. The voltage developed across the capacitive shunt is determined almost solely by the current through the primary insulation and lags this current by a phase angle of almost exactly 90 degrees. This voltage is passed through a 2-conductor, shielded cable to a voltage interface amplifier which reduces it to a filtered, protected voltage compatible with the control unit input requirements (approximately 5 volts).

The reference source, which can be a magnetic voltage transformer connected to the same high voltage bus as the equipment being monitored, develops a voltage which is a known fraction of the bus voltage and precisely in phase with it. This voltage is passed through a similar 2-conductor, shielded cable to a similar voltage interface amplifier wherein it is reduced to a voltage similar to that developed from the capacitance tap.

The voltage transformer should be as accurate as possible (0.3 percent preferred) and also as lightly loaded as possible; however, normal loading is acceptable if said 2-conductor, shielded cable goes all the way to the transformer, thus bypassing the cable voltage drop caused by normal metering and/or relaying loads. Otherwise, we have found that these loads can cause errors as high as 2 percent power factor and/or capacitance if their cable is not bypassed. Alternatively a capacitive potential device can be used as a reference source if it is carefully tuned and phase tested. A phase error of one degree will cause a 1.75 percent power factor error. Once tuned, the loading of the potential device should not be changed.

In this first embodiment of the instant invention the control unit of same computes power factor by measuring phase angle. The details of such computations will be described infra. The results are continuously displayed and the alarm circuit may provide some type of alarm output.

A principal feature of our specially designed capacitance tap adaptor is the provision for the use of two shunt capacitors. The value of the capacitors is selected so that, added together, they provide a shunt to ground that, with normal insulation current flowing through it, develops a voltage of between 10 and 140 volts RMS. Since the normal voltage of an open circuit capacitance tap is usually about 10,000 volts, the voltage developed is determined almost solely by the insulation current, with other factors having an effect of about 1 percent or less. The type capacitor is also important; the dissipation factor (or power factor) of the two capacitors should be very low or at least a precisely known, stable value. The specified capacitors have a dissipation factor of 0.02 to 0.03 percent at 60 Hz. For ultimate accuracy, this factor is added to the insulation power factor measured by the apparatus. The reason for using two capacitors, instead of one of twice the value of capacitance, is to limit the voltage in case of capacitor failure. For instance if only one capacitor is used, and it fails open, or a lead breaks, the output voltage from the capacitance tap adaptor could increase to about 10,000 volts, damaging the apparatus and constituting a safety hazard. With two capacitors, the output voltage is limited to 20 to 280 volts, unless both fail simultaneously, considered highly unlikely if the capacitor voltage rating is more than twice the expected normal output voltage. An open capacitor will normally be detected by the fact that the insulation capacitance indicated by the apparatus would be twice the correct value. An important consideration which makes this argument valid is that each capacitor's leads are completely independent.

A voltage interface amplifier is used and designed for compatibility with said capacitance tap adaptor with the high side, low side, and shield wires of the cable from the capacitance tap adaptor connected thereto. A capacitor completes the reactive differential balance of this interface amplifier, since the high side comes from a 2 microfared capacitive shunt in the capacitance tap adaptor. The low side, on the other hand, is grounded directly at the capacitance tap adaptor. A pair of resistors as well as a pair of varistors form a protective transient suppressor circuit. Since the varistors also have inherent capacitance, this resulting suppressor circuit combines with another pair of resistors as well as a pair of capacitors to form a two-pole, low-pass filter, with a gradual rolloff which is 3 dB down at about 8 kHZ. This filter suppresses high frequency interference while causing a phase shift at 60 Hz of only about 0.5 degrees.

Also provided is a differential amplifier with an attenuation factor of 20:1 (26 dB of voltage loss). The large voltage reduction allows this circuit to work properly with an input voltage of up to 150 volts RMS. A trimpot and associated capacitor may also be provided to set the phase shift of the capacitance tap channel to equal that of the reference channel. A unity-gain operational amplifier serves as a buffer and impedance amplifier. Said differential amplifier, while not an absolute necessity, is very effective in reducing interference from nearby high current conductors. Such interference can create considerable error on a long cable run, and cannot always be reduced sufficiently by shielding alone. The combination of the differential amplifier and the shield, which is grounded solidly at both ends, eliminates virtually all 60 Hz interference. This same circuit is used to interface with the reference voltage. The reference is usually taken from either a magnetic potential transformer or a tuned capacitive potential device. In either case, the voltage input to the circuit is usually either 67 or 120 volts RMS, with which the circuit is fully compatible.

As has been note supra, any difference in phase shift between the capacitance tap amplifier and the reference voltage amplifier must be calibrated out of the system. This is done by applying the same voltage to both circuits, with the voltage to the capacitance tap circuit being applied through a capacitance equal to the total of the capacitance tap, capacitance tap adaptor, and cable. The apparatus is set to read zero (or the capacitance tap adaptor dissipation) with this voltage applied as described.

Resistors and diodes are employed to clip the waveforms symmetrically and to protect two voltage comparators. The waveforms are thereby converted to true square waves, with transitions at zero and 180 degrees of the original waves. A pair of resistors serve to "pull up" the outputs of the voltage comparators. In combination therewith, a pair of EXCLUSIVE OR gates serve as noninverting buffers to make these converted true square waves fully compatible with the remaining CMOS circuitry. A third EXCLUSIVE OR gate in combination with the pair supra has a high (positive) output whenever the waveforms are opposite (one high and the other low), and a low (zero) output when they are the same (both high or both low). Thus, if the waves are exactly in phase and have the same symmetry, said third gate should always have a low output. If the waves are slightly out of phase, the output of said third gate will be a string of short pulses, with the length and position of the pulses being the same as the time between the zero crossings of the two waves. Remembering that positive pulses are generated at both positive and negative zero crossings, so the repetition rate is twice the line frequency, a distinction can be made concerning which wave leads so that the appropriate pulses can be passed through to charge a storage capacitor to the correct polarity and to block the inappropriate pulses.

To this end, a plurality of monostable multivibrators have timing networks (200,000 ohms and 0.022 microfarad) that provide output pulses of about 2.4 milliseconds, much longer than the 0.53 millisecond pulse length necessary to give a full scale (20 percent) power factor reading, are employed. A first one is triggered by the positive going zero crossing of the R (reference) wave and a second one by the negative going zero crossing of the same R wave. A first NAND gate takes its input from the NOT Q outputs of said first one and said second one, so the output of said NAND gate is low most of the time; it goes high, however, for 2.4 milliseconds starting at each zero crossing (positive or negative) of the R wave. If the R wave is leading the C wave, as it should for a positive power factor, then the pulse generated by said third EXCLUSIVE OR gate supra at each zero crossing, occurs during the 2.4 millisecond pulse generated by said first NAND gate. The two pulses drive the output of a second NAND gate low for a time equal to the shorter of the two pulses. If the C wave is leading the R wave, then the pulse generated by U5C occurs before the 2.4 millisecond pulse, and said second NAND gate is not driven low. The net result is a negative going pulse at said second NAND gate output when, and only when, any zero crossing of the R wave occurs before that of the C wave. An additional requirement is that the waves be within 90 degrees of each other.

The pulses from said second NAND gate go from plus 15 volts to zero volts. These are capacitance-coupled to a two-stage, noninverting buffer operating between minus 15 volts and zero volts. Thus, the delivered pulses are negative going from zero to minus 15 volts. Said pulses feed into an inverting, zero impedance (current summing) amplifier, so the negative pulses charge a storage capacitor such as to drive said amplifier output positive (point M, see discussion of FIG. 5 supra).

Likewise, a mirror bank of circuit components operate in an identical manner to that described above to produce negative going pulses at the output of still another second NAND gate when, and only when, any zero crossing of the C wave occurs before that of the R wave. These pulses are subsequently inverted by an EXCLUSIVE OR gate, pass through a diode to charge said storage capacitor so as to produce a negative output at said point M.

This circuit reads both positive and negative power factor. Although negative power factor cannot actually occur in insulation, the circuit must still respond to it, because alternate or random pulses of opposite polarity can occur due to waveform distortion, dissymmetry, or noise. Pulses of both polarities must be properly averaged together for accuracy near zero power factor.

The resulting voltage developed at point M (10 volts dc positive for full scale power factor of 20 percent) is passed through a resistor to a 10 volt output. It is also applied to a current pump composed of operational amplifier and the associated 10,000 ohm resistance bridge. The current pump supplies up to 1 ma to the current output, which is independent of the external resistance up to the voltage compliance limit. The output of the operational amplifier must always be twice the voltage at the current output terminal. Since the voltage at the output of the operational amplifier is limited to about 12 volts, the voltage at the current output is limited to 6 volts. Thus, the maximum load resistance is 6,000 ohms if full scale current of 1 milliamp is to be delivered.

The voltage at said point M is also passed to a voltage divider. Twenty percent of the voltage is passed to a digital panel meter, which is set for 2 volts full scale. The digital panel meter has 3½ digits, and the decimal point is fixed so that a full scale indication of 19.99 is provided. The same voltage divider passes 25 percent of the voltage at said point M to a voltage comparator, which drives an alarm relay. A diode protects the output transistor of said voltage comparator from transients caused by the associated inductive relay coil. The level that trips the relay may be set by a potentiometer or, for better alarm setting accuracy, a switch with precision resistors can be substituted therefore. It and a resistor comprise a voltage divider between plus 15 volts dc and ground. Hysteresis and positive feedback are provided by the use of a pair of resistors, assuring that the relay picks up completely with a minimum of chatter. The amount of hysteresis is about 1.5 percent of full scale or about 0.3 percent power factor. If the power factor decreases to 0.3 percent below the alarm set point, the alarm resets. A capacitor is utilized to guard against the alarm being set off by noise or a transient.

EMBODIMENT TWO

The second embodiment of the present invention is the one that we feel is the best version of the apparatus because it is more easily expandable and provides more information than the first embodiment. The attendant computer equipment includes a monoboard microcomputer module, two ADC modules, a parallel interface module, a battery backed random access memory and realtime clock, and a power supply module. A first multiconductor bus is provided to connect the two ADC modules, and the parallel interface modules to the microcomputer module and to the power supply module. A second multiconductor bus is provided to connect the microcomputer module to the battery backed memory and the realtime clock module. Both buses have provisions for connections to additional modules.

An ambient temperature probe is used with this second embodiment of the present invention and the output therefrom feeds into the control unit computer through an ADC.

The active range of this temperature probe is 0° F. to 140° F., corresponding to a voltage output of 3.8 to 5.0 volts. The large common-mode voltage is subtracted digitally, rather than using a drift-prone analog circuit. The temperature sensor (804) is mounted snugly, with epoxy, into a hole in the probe case, so that the whole probe becomes a heat sink which assumes ambient temperature. This construction provides "peak filtering," with a time constant of about 15 minutes. The probe is filled with a potting compound for waterproofing. The entire probe is calibrated over the active temperature range, and appropriate constants are stored in the computer. Sufficient accuracy could probably be attained by calibrating only at room temperature, however.

An alternative temperature measuring scheme which has also been used involves utilizing the digital BCD output of a commercial digital thermometer. The BCD output is interfaced through an input/output (IO) port on the computer.

A transducer interface amplifier is used for monitoring temperature, pressure, or any other quantity from a transducer with 0-to-5 volt or 4-to-20 ma dc output. The amplifier has unity gain, with no provision for zero or offset null, which, if needed, is done in other places.

Depending on the transducer output the value of the resistor between said output and ground may be, for a 4-to-20 milliamp transducer, 250 ohms, so that 1-to-5 volts is passed to the operational amplifier. On a 0-to-5 volt transducer, the value of said resistor is 1 megohm, which serves only to hold the output near zero volts when there is no input connection.

A pair of resistors, a varistor, and a capacitor provide transient protection. One of said resistors and said capacitor also form a one-pole, low-pass filter with a 3 dB cutoff frequency of 0.16 Hz. The operational amplifier has a field effect transistor input, so its input impedance is much higher than the 1 megohm filter impedance. Said operational amplifier is connected for unity gain, so the 1-to-5 or 0-to-5 volts across the resistor between said transducer output and ground, after being filtered, appears at the output to the ADC. The transducer power supply may be located in the control unit or at the transducer. It should be run on separate wires if a 0-to-5 volt transducer is used.

A synchronized frequency multiplier circuit is used in the second embodiment of the instant invention to provide timing pulses for the ADC. It uses a CMOS phase-locked loop, CD4046B, which has a phase comparator (phase comparator II) that allows phase lock between two waves without allowing any phase difference between them. The input is usually taken from the voltage reference source, and is usually either 67 or 120 volts ac. A resistor and a pair of zener diodes limit the voltage and protect the voltage comparator, which with a pair of resistors, further squares up the waveform. A transistor, along with another pair of resistors, converts the wave to a 0-to-5 volt square wave compatible with that needed by the phase-locked loop.

For the phase-locked loop to operate as a frequency multiplier, its VCO must operate at the desired high frequency. Since the input frequency of 60 Hz is to be multiplied by 32, the VCO operates at 1920 Hz. Still another pair of resistors and a capacitor set a frequency range to include 1920 Hz. Since the signal input to the phase comparator (1123) is 60 Hz, the VCO output of 1920 Hz is divided by exactly 32 by a counter. The counter output of 60 Hz goes to a second phase comparator input. The phase comparator output, which is the frequency/phase error signal, is filtered. The VCO input fine tunes the VCO frequency to attain and hold frequency and phase lock with the input signal. A buffer passes the 1920 Hz square wave to a first output and the 60 Hz square wave to a second output. The waves are precisely synchronous with each other and tightly locked to and in phase with the input wave. By using these waves to control the ADC, exactly 32 voltage samples can be taken of each cycle of each input wave, or one sample every 11.25 degrees.

As noted supra the instant invention and the apparatus employed in the conduct thereof effectively compares the capacitance tap current with the applied voltage, taken from a voltage transformer, and computes power factor and capacitance by adaptations from the following formulas:

$$\text{POWER FACTOR} = \left( \int_0^T vidt \right) / (VIT).$$

-continued $$\text{POWER FACTOR} = \cos(A) \simeq \pi/2 - A$$

$$\text{CAPACITANCE} \simeq I/(2\pi f V)$$

where v and i are the instantaneous values of reference voltage and capacitance tap current, respectively, V and I are the RMS values of the same voltage and current, T is one period of line frequency, f is the system frequency, and A is the phase angle (expressed in radians) by which i leads v. Since A is normally between 1.47 and $\pi/2$ (i.e., 84 to 90 degrees, with the power factor 10 percent or less), the approximations are valid.

In the practice of the instant invention in this "Embodiment Two" the first and third formula just supra are utilized, however, they cannot be used directly because the computer must deal with discrete points rather than continuous functions. The voltage and current waveforms are synchronously sampled precisely 32 times each cycle for 16 cycles (about 0.27 seconds). Samples taken at the same angle for each of 16 cycles of the wave are summed together until a complete set of 32 sums has been acquired. Thus, for example, we have a sum of 16 samples made on successive cycles at zero degrees, another sum at 11.25 degrees, another at 22.5 degrees, etc., on up through the 32nd sum at 348.75 degrees.

Because a capacitive shunt is used to detect the capacitance tap current, a 90 degree delay is introduced. To compensate for this 90 degree delay, the reference voltage is also delayed 90 degrees. This delay is accomplished digitally, by shifting backwards in time, along the reference wave, by 8 sample sums. Since only 32 sample sums (one equivalent cycle) are saved, the 8 sums representing the leading 90 degrees are wrapped back to represent the last 8 sums of the previous equivalent cycle.

The formulas shown above are modified as shown below so as to allow the computer and software instructions associated therewith to utilize the discrete sampling points and the various correction factors necessary for the complete, concise, and correct application of the analog input data from the capacitance tap adaptor, reference voltage source, and temperature transducer.

$$\% \text{ POWER FACTOR} = D + 100(\Sigma X_n Y_{(n-8)})/((\sqrt{\Sigma X_n^2})(\sqrt{\Sigma Y_n^2}))$$

ESTIMATED INTERNAL TEMPERATURE =

$$T_{i(m)} = AT_{a(m)} + BT_{i(m-1)}$$

TEMPERATURE CORRECTED % POWER FACTOR =

$$[\% \text{ POWER FACTOR}] [H_0 + H_1(T_i - 68) + H_2(T_i - 68)^2 + H_3(T_i - 68)^3 + \ldots H_8(T_i - 68)^8]$$

$$\text{CAPACITANCE}, pf \simeq (C_s G_p \sqrt{\Sigma X_n^2})/(R_p G_c \sqrt{\Sigma Y_n^2})$$

where:

D is a correction factor, determined during calibration, to compensate for phase shift in the analog circuits;

X and Y are the sample sums of the voltages delivered to the computer from the capacitance tap adaptor and the referenced source, respectively;

$T_i$ is the most recently computed estimated internal temperature in degrees Fahrenheit;

$T_{i(m)}$ is the estimated internal temperature presently being computed;

$T_{i(m-1)}$ is the estimated internal temperature computed one measurement period previously;

$T_{a(m)}$ is the most recently measured ambient temperature in degrees Fahrenheit;

A is 1/K;

K is the time constant expressed in units of the measurement period (usually minutes);

B is 1−A;

$H_0, H_1, H_2, H_3 \ldots H_8$ are the coefficients of the best fit eighth order power series, computed by the method of least squares, to describe the power factor temperature characteristics according to the standard instrument transformer correction curve shown in the article "Variations of Power Factor with Temperature" by A. L. Rickley and S. H. Osborn, Jr.;

$C_s$ is the total shunt capacitance, including the capacitance tap, the capacitance tap adaptor, and the cable, in picofarads (pf);

$R_p$ is the potential transformer (pt) ratio;

$G_p$ is the gain of the voltage reference interface amplifier; and $G_c$ is the gain of the capacitance tap interface amplifier;

All summations in the above formulas are carried out from n=1 to n=32, the number of samples per cycle.

GENERAL MICROCOMPUTER SOFTWARE DESCRIPTION 1.0 Startup Routine
  1.1 Initialize peripheral ports for printers, terminals, alarms, and analog sampling control interrupts.
  1.2 Clear to zero all accumulator memory used for summations. Clear status and control flags.
  1.3 Compute correction factors for percent power factor and capacitance computations. Correction factors are functions of the electrical parameters of the interface network that are determined by calibration and stored in nonvolatile memory. Compute scale factors and coefficients for conversion of other analog inputs—temperature, pressure, etc.—to desired units.

2.0 Wait for Event Routine
  2.1 Check Time Instruction
    Check time and if time for measurement, go to Measure Subroutine; otherwise, skip the Action Instruction Set (2.2) and proceed to Keyboard Entry Instructions (2.3).
  2.2 Action Instruction Set
    Following measurements and computations, check results of computations and determine action to be taken—alarm, print record, daily averages, monthly averages, etc.
  2.3 Keyboard Entry Instructions
    Check for operator entries from terminal and perform required task. Print record(s), list variables, list command table, update variables, etc.
  2.4 Return to Check Time Instruction (2.1)

3.0 Major Subroutines
  3.1 Measure 3.1.1 Setup for response to analog sampling control interrupts. Setup arrays for data accumulation. Begin analog-to-digital conversion and accumulation of data. Perform intermediate calculations and continue until all samples for the measurement interval are obtained.

3.1.2 Compute results—percent power factor, capacitance, temperatures, and other desired results. Compute internal temperature and temperature corrected percent power factor. Check for results within specified bounds and sum good data to accumulators for daily and monthly averaging.

3.1.3 Return to Wait for Event Routine, Action Instruction Set (2.2)

3.2 Percent Power Factor and Capacitance Computation 3.2.1 Data Accumulation

The Measure subroutine has resulted in he summing of up to 256 data sets for each piece of monitored equipment, with each data set consisting of 32 samples each of the current and voltage waveform taken over one cycle of the waveform. Data may be taken continuously every 11.25 degrees for up to 256 cycles, or may be taken in 16 groups of 16 cycles. The current from each piece of monitored equipment is sampled in rapid succession, with its particular reference voltage being sampled simultaneously.

3.2.2 Accumulated Data Format

The resulting format is a combined set of 32 sample sums each of the current and voltage waveforms of each piece of monitored equipment. Each set appears to be from one cycle, but actually represents a total of many cycles.

3.2.3 RMS Computation—Current and Voltage

Each of the 32 waveform sample sums is squared. They are then added together and this sum is, in effect, divided by 32 times the number of original data sets. The square root is then taken. The result is the equivalent RMS current and RMS voltage for each piece of equipment monitored.

3.2.4 Watts Computation

Each voltage is delayed exactly 90 degrees by shifting eight samples back (or 24 samples forward) in time. Each current sample sum is then multiplied by its new equivalent voltage sample sum and the products are added together. This sum is, in effect, divided by 32 times the number of original data sets. Expressed mathematically:

$$W = \left( \sum_{n=1}^{n=32} X_n Y_{[n-8]} \right) / (32\, S)$$

Where W is watts, X and Y are the individual current and voltage sample sums, respectively, and S is the number of data sets. In the first 90 degrees of the current wave, when n minus 8 is negative, n plus 24 is used. The reason for the 90 degree voltage delay is to compensate for the 90 degree current delay caused by using a capacitive rather than resistive shunt in the capacitance tap adaptor. A resistive shunt was not used because it would have increased the high frequency interference and harmonic content of the wave being sampled.

3.2.5 Final Computations

The power factor and capacitance are computed by the following expressions:

$$PF = W/(IV)$$

$$C \simeq KI/V$$

Where PF and C are the power factor and capacitance, respectively, of the equipment being monitored; W, I, and V are the watts, RMS current, and RMS voltage computed above; and K is a constant which includes $\frac{1}{2}\pi f$, the voltage reference ratio, the capacitance of the capacitance tap adaptor, and other corrections so that C can be expressed accurately in picofarads. The power factor is corrected for phase error in interface equipment and multiplied by 100 to be expressed in percent. The formula for capacitance is an approximation which ignores the resistive component of I. This approximation is excellent with a power factor of 10 percent or less and adequate up to 20 percent.

3.3 Computation of Temperatures, Pressures, Hydrogen, etc.

Various transducers for measurement of required parameters may be incorporated. At the end of each measurement interval, the accumulated data is processed and scaled for appropriate units. Scale factors are stored in nonvolatile memory and may be changed by an operator if required.

3.4 Alarm Analysis

There are certain preset alarm levels that are stored in nonvolatile memory and may be changed by an operator. The alarm levels may be set for percent power factor, internal pressure, parts per million hydrogen, etc. Each variable may be independently assigned specified alarm levels including no alarm. There are two alarm levels for each variable; a warning level and a danger level. After each measurement interval, each variable is checked for an alarm condition. If the preset warning alarm level has been exceeded for a specified time, the data may be printed with flags for each variable. If the preset danger alarm level has been exceeded for a specified time, various methods may be employed to alert personnel or automatically disconnect the monitored equipment. The data may also be printed with appropriate flags.

3.5 Trend Analysis

Following each measurement interval, specified variables (percent power factor, pressure, hydrogen, etc.) may be checked for specified increases over the most recently printed data. When the specified changes are detected, a record with appropriate flags is printed.

3.6 Daily and Monthly Averages

Specified results of each measurement are accumulated and daily averages of temperatures, temperature corrected percent power factor and capacitance are computed and stored in nonvolatile memory. At the end of each month, monthly averages are computed and stored in nonvolatile memory. Averages for the most recent 32 days and for the most recent 12 months are saved and may be listed by an operator command. Daily averages include flags to indicate exceptional variations (increases) in percent power factor, pressure, hydrogen, etc.

3.7 Compute Estimate of the Internal Temperature of Monitored Equipment

Computation of percent power factor corrected for temperature is based on standard temperature correction curves, using an estimated internal temperature which is derived from measured ambient temperature. A step change in ambient temperature is assumed to produce an exponential change in internal temperature, so that eventually the internal temperature would become essentially equal to the new ambient temperature.

To implement this concept for digital computation, where the ambient temperature is measured at discrete time intervals, the expression below is used:

$$T_{i(m)} = AT_{a(m)} + BT_{i(m-1)}$$

Where:
$T_{i(m)}$ is the updated internal temperature being computed
$T_{a(m)}$ is the most recently measured ambient temperature
$T_{i(m-1)}$ is the most recent previously computed estimated internal temperature
A is 1/time constant, K
B is 1−A The time constant, K, is stored in nonvolatile memory and may be changed by an operator. It is typically several hours, and is expressed in units of the discrete time interval.

4.0 Other Subroutines Used
  4.1 Square root
  4.2 Binary to decimal conversion
  4.3 Decimal to ASCII conversion
  4.4 ASCII to decimal conversion
  4.5 Decimal to binary conversion
  4.6 Double precision multiply
  4.7 Double precision addition
  4.8 Extended divide

EXAMPLES

In order that those skilled in the art may better understand how the present invention can be practiced, the following examples are given by way of illustration only.

EXAMPLE I

In the pursuit of further information gathered for the purpose of more clearly defining the parameters affecting the practice of the instant invention the investigations herein were made in response to the excessive number of violent current transformer (ct) failures at the Raccoon Mountain PSP. Accordingly, in our earliest work a computerized ct damage monitor was developed in the Central Laboratories and first installed in the Raccoon Mountain switchyard. The first pilot model was tested on the ct's on breaker 834. Subsequently, an upgraded prototype was installed on the ct's on breakers 874 and 878. The ct monitor records power factor and capacitance of the ct insulation, along with the amount of hydrogen gas in the oil if the ct is equipped with a Syprotec (Manleh) Hydran 201R monitor. NOTE: No endorsement of this type of monitor, or for that matter, any other type of equipment named herein, is intended, or to be so construed. The embodiment of the ct monitor prototype installed at the Raccoon Mountain site was designed for up to 12 cts, but only 6 were monitored at any one time. Several ct's on breakers other than 874 and 878 were monitored for a time by substituting them for ct's not showing any problems.

The purpose of the ct monitor is to detect impending ct failures so that the ct's can be removed from service before they explode.

The original prototype monitor at Raccoon Mountain "caught" four ct's that almost surely would have failed soon. All four were associated with breaker 874. They include the original ct's in the B-phase and C-phase positions and the replacement for each, which were of the same vintage. In addition, a ct on breaker 888, while not monitored, was deenergized, tested, and removed from service because of very high hydrogen content and Doble power factor reading. This ct was suspected and tested because it had characteristics and history similar to the replacement ct on 874, C-phase, which had shown very rapid deterioration on the ct monitor.

Several unmonitored ct's exploded during the summer, and several others were removed from service because periodic sampling revealed high hydrogen content in the oil.

When the ct monitor was first installed, the highest power factor was found on C-phase of breaker 874 (874C). The next highest measured power factor was found on 874B. Neither of the indicated power factor values were considered excessive, but with no experience on what "excessive" was, they were monitored very closely. The power factors went up and down with temperature fluctuations throughout the day. This was expected because heat, in general, degrades insulation. The daily average power factors also fluctuated with changes in average temperature from day to day.

This fluctuation was somewhat surprising since the daily averages are all corrected to 68° F. according to the standard instrument transformer correction table. It turns out that when the power factor of a ct is relatively high, it increases more with a temperature increase than the correction table would predict. Good cts, on the other hand, behave about like the table indicates they should.

The extreme temperature sensitivity of the high power factor ct's is undoubtedly caused by self heating of the insulation. In these cts, every 1 percent power factor results in about 60 watts (205 Btu/hr) of heat which must be removed from the insulation. Since most of this heat is deep in the paper and not readily removed, the temperature must increase to well above ambient when the power factor is high. This temperature increase causes the power factor to go even higher. The result is regenerative amplification, an effect similar to that shown by a regenerative brake or an electronic amplifier with positive feedback.

Though ct's 874C and 874B went to relatively high power factors on warm days, they came back down on cool days, and no trends were observed for the first few months. Data sheets and graph sheets, compiled through this investigation, showed that for all of the daily average power factors for the monitored ct's for a period of about three months, three of same, to wit, 874C, 874B, and 888C (monitored only for eight weeks) showed similar patterns of power factors being about an order of magnitude higher (0.8–2.0 vs. 0.1–0.2+) than the rest of the ct's. In addition, these three ct's showed substantial fluctuations of observed power factor with daily fluctuations of ambient temperatures. The observed power factors of the others were much lower, and showed little temperature fluctuation, indicating that the standard temperature correction table is about right for good cts. It was also observed that the fluctuations of 874C, 874B, and 888C tended to lag behind the ambient temperature; in effect, one day's average power factor is controlled mostly by the preceding day's average temperature. It is postulated that this thermal lag is due to the 10-to-12 hour thermal time constant exhibited by these cts.

Original 874C (K71911-01 No. 2)—When we compared the power factor of any of these ct's with its power factor at the same approximate temperature on an earlier date, no significant difference can be seen during this three month test period; no trends can be observed. This situation changed during the fourth month, however. Toward the end of the fourth month, the power factor on 874C started increasing without correspondingly increasing temperature. This trend continued until early in the fifth month, when ct 874C was deenergized to take an oil sample. (During this period, the continuous gas monitors were back at the factory being modified.) A laboratory analysis of the oil showed only 50 parts per million (ppm) of hydrogen, so the ct was returned to service. The power factor continued upward until the ct was removed from service permanently one week later. A gas analysis then showed 220 ppm hydrogen.

Replacement 874C (K71911-01 No. 4)—This ct had previously been removed from another breaker at Raccoon Mountain because of damage caused by the explosion of an adjacent ct. It had been sent to the Power Service Shops for repair, then returned to Raccoon Mountain for further service. From August 20 through August 27, the power factor of the replacement 874C held reasonably steady at about one percent. The upturn on August 28 could be attributed to rising temperature. On August 29, however, a definite increase was observed, as the replacement 874C rose above 874B (which had also started upward by this time). From then on, the power factor of 874C rose continuously. The gas was essentially zero until August 30, when it rose to an average of 55 parts per million. On August 31, the gas went off scale (above 1000 ppm) to stay. The replacement 874C was removed from service on September 3, and a lab analysis of an oil sample showed 9720 ppm of hydrogen.

888A (K71911-01 No. 5)—This ct was installed, with no monitoring hardware, at about the same time the replacement 874C was installed. The two ct's had similar histories; both had been damaged and repaired at the Power Service Shops. When the power factor and gas on the replacement 874C went very high, 888A became a suspect. At the first opportunity, it was deenergized, with the intention of installing hardware for monitoring power factor. An oil sample was taken, and a lab analysis showed 12,930 ppm of hydrogen. A Doble power factor test, made a few hours after the ct was deenergized (and while still warm) showed 8.3 percent power factor on the UST test (between the top of the bushing and the capacitance tap). The ct was not returned to service.

After about five weeks of operation, this ct was unwrapped to search for damage. Wrinkles were found in the paper and semi-conductor layers, some of which showed apparent partial discharge tracking. A sticky, wax-like material was found throughout much of the insulation, indicating decomposition of the oil because of high temperature and/or high electric field strength. Evidence of high temperature was found, exhibited by the discoloration of some of the copper braid and a slight charring of some of the paper. The ct was judged to have reached a state that was unfit for service; however, the specific cause of the damage could not be determined.

Original 874B (K71911-01 No. 6)—This ct showed the first signs of power factor increase at about the time the replacement 874C started its irreversible, catastrophic climb toward destruction. The upturn of 874B started about a week after the end of a week's outage, and increased very slowly at first. Through the next month the power factor appeared to hold steady except for daily temperature fluctuations. If we look at the graphical depiction of the temperature, however, we see the normal downward trend expected this month (September), which is not reflected in the power factor of 874B. Also, 874B can be compared with 844A, which has a definite downward trend through the month.

Since the effective power factor increase in 874B was so slow, we had hoped it might last through the winter. However, the power factor started up rapidly and unmistakably and the ct was taken out of service about a month after 874C started toward destruction supra. We noticed that the gas had increased through most of the previous month, but was not excessive. When the ct was deenergized, a laboratory analysis indicated a relatively high gas content, but the continuous gas monitor reading had decreased to a very low value. However, while the ct sat idle for a week, the continuous gas monitor reading increased to the highest value yet seen on this ct, a maximum of 294 ppm. This increase was probably caused by better gas diffusion and oil circulation during the week, since it is not likely that any new gas would be generated with the ct deenergized.

Replacement 874B (K71911-03 No. 2)—This ct has a history similar to the replacement 874C and 888A. This ct was damaged less severely than they were, however, and Power Service Shops personnel were able to repair it without removing the windings from the oil.

From the time it was installed the power factor was high. The power factor increased steadily until the ct was removed from service two days later. The gas monitor read essentially zero the whole time.

It is customary for a high power factor to increase during the first day or two of operation due to self heating (mentioned earlier). After two days, however, it should have leveled off. Since it did not and was already up to almost 5 percent, the ct was removed from service.

EXAMPLE II

In the pursuit of still further information, gathered for the purpose of more clearly defining the parameters affecting the practice of the instant invention, the investigations herein were made to determine the response of various types of cts via a monitoring system, somewhat similar to that used at Raccoon Mountain and described in Example I supra. In the tests comprising this Example, the setup was to allow for testing a plurality of cts at both 161 kv and 500 kv operating levels and emphasis was directed herein to ascertain the reasons underlying ct failure, and also to determine the gas and power factor levels that could be determinative of alarm conditions for removal of same from service.

A ct test facility has been constructed at Wilson Substation. Barriers were built in the 500 and 161 kv switchyards so that defective cts could be tested, and if they failed, minimal damage would be done. Fire sensors were installed to alert operators in case a failure resulted in a fire. Four cts, two each at 500 and 161 kv, can be tested simultaneously.

An updated power factor monitor was installed at Wilson which monitored pressure in addition to power factor, capacitance, hydrogen, and temperature. In all, three 161 kv cts and two 500 kv cts were tested. Four of the five had a history of high power factor and/or gas.

Two of the 161 kv cts had been removed from Raccoon Mountain the previous year because of high power factor and gas. At Wilson, the power factor and gas went even higher, confirming the reliability of either type monitor. It was also determined that oil pressure, which normally fluxuates with temperature, also increases with high power factor (because of self-heating) and could be used for monitoring purposes. One of said 161 kv cts got so bad that (in addition to a power factor well over 10 percent in cool weather) its dissolved hydrogen reached more than 30,000 ppm. The excessive gassing also caused a sharp pressure increase because when the oil became saturated, the undissolved gas formed a blanket at the top of the ct.

Another 161 kv ct was removed from service at a nuclear plant because of gassing. It was modified to allow a hydrogen probe to be installed in such a way as to maximize response. It was then degassed and monitored at the Wilson facility for six months. The power factor was relatively high, but did not increase during the period, except for normal fluxuations with temperature. No hydrogen was detected and there were no abnormal pressure trends. The ct was judged tentatively serviceable, but because of its history, will not be returned to service. Power factor and gas increases in the past indicates a high probability of further increases in the future.

The two 500 kv cts have also been monitored for six months. Both have shown low power factor (generally less than 0.3 percent), low gas (less than 200 ppm), normal pressure, and no trends. Though judged serviceable, they will probably not be returned to service because of past problems.

EXAMPLE III

Because of the large number of ct failures and near failures at Raccoon Mountain the decision was made to replace all 42 of the 161 kv cts there with explosion-proof SF-6 types. A substantial period of time would be required for delivery, however. Since more failures could be expected during the ensuing hot weather months the prototype ct monitor was further improved, updated, and expanded to 24 channels, power factor only (the practical limit with existing hardware). This expansion allowed most of the remaining original cts to be monitored.

During said hot weather months, five cts were "caught" and removed from service because of sharply increasing power factor. All subsequently showed an increase in combustible gas by laboratory analysis (no hydrogen monitors were used). Another ct (with no monitor) was caught by routine gas sampling. For the first time in several years, thanks to the power factor monitor, there were no explosive failures.

It now has been established that there are at least two viable methods by which current transformers can be monitored for impending failure. Power factor monitoring appears to provide the quickest indication of trouble, but gas monitoring should also provide adequate warning if a continuous monitor such as the Hydran 201R can be used. As noted supra, no endorsement of any product named herein is intended or to be so construed hereby. It appears that periodic sampling of oil will not always provide adequate warning since it would be impractical to sample often enough to always catch a ct with very rapid deterioration.

A further benefit of this project is that at least nine ct's were removed from service before violent failure. They may or may not have been caught by routine oil sampling if the ct monitor had not been in service.

INVENTION PARAMETERS

After sifting and winnowing through the data supra, as well as other results and operation of our new, novel, and improved technique, including methods and means for the effecting thereof, the operating variables, including the acceptable and preferred conditions for carrying out our invention are summarized below.

| Variables | Preferred Limits | Most Preferred Limits |
|---|---|---|
| Voltage reference source | Magnetic voltage transformer, 0.3% accuracy class | Lower accuracy transformer; capacitive potential device |
| Voltage reference external loading: | | |
| Magnetic voltage transformer | Light, unchanging | Normal, unchanging |
| Capacitive potential device | None | Light, unchanging |
| Cable connection to voltage reference source | 2-conductor shielded all the way to source | Any type, anywhere, but only if external loading is very light and unchanging |
| Capacitance tap adaptor | 2-1 microfarad polystyrene capacitors in parallel | Any stable capacitor, 0.1 microfarad or higher |
| Voltage drop across capacitance tap adaptor | 50 to 100 volts | 10 to 140 volts |
| Cable connection to capacitance tap adaptor | 2-conductor shielded | Single conductor shielded, unshielded or part of a bundle if no other ac wiring is in the bundle or nearby and voltage across capacitance tap adaptor is 50 volts or more |
| Capacitance tap external | None | Light loading acceptable if unchanging and if |

| Variables | Preferred Limits | Most Preferred Limits |
|---|---|---|
| loading | | capacitance tap is carefully phase checked. |

While we have shown and described particular embodiments of our invention, modifications and variations thereof will occur to those skilled in the art. We wish it to be understood therefore that the appended claims are intended to cover such modifications and variations which are within the true scope and spirit of our invention.

What we claim as new and desire to secure by Letters Patent of the United States is:

1. In an improved apparatus for simultaneously and continuously monitoring, in situ, the insulation characteristics of a plurality of separate pieces of high voltage alternating current electrical equipment including instrument transformers, high voltage bushings of power circuit breakers and transformers, and other like equipment, each of said pieces of electrical equipment being provided with a capacitance tap, said apparatus comprising:

(A) separate capacitance tap adapter means for providing coupling between said apparatus and each of said capacitance taps;
   (B) separate impedor means operatively associated with each of said capacitance tap adapter means and having an electrical impedance so low that current in said impedor means is substantially determined by the impendance of the insulation of said equipment being monitored, and of such value that the voltage between said capacitance tap and ground is in the range of about 10 to about 140 volts ac RMS;
   (C) separate connector means permanently associated with each said impedor means for permitting coupling of an external circuit to said impedor means without interruption of current through said insulation; and
   (D) external circuit means adapted to be coupled to said impedor means and responsive to a signal applied to said impedor means from said electrical equipment, the insulation characteristics thereof being monitored, said connector means permitting said external circuit to be detachably coupled to said impedor means;

the improved apparatus in combination therewith for providing for simultaneous, continuous monitoring, of more than one such piece of equipment, for providing voltage limiting characteristics and attendant protection for said external circuit upon the occurrence of a failed open event of said impedor means and/or leads operatively associated therewith, thereby substantially eliminating possible human safety hazards and damage to said external circuit, and for all said pieces of electrical equipment that are on the same voltage and phase, for eliminating the requirement for providing a plurality of connecting means for coupling a reference voltage source normally juxtaposed said external circuit, which external circuit is normally remotely located relative to said piece of electrical equipment and which improved apparatus comprises:

(1) as each of said impedor means, at least two shunt capacitors of capacitance value selected such that added together they provide a shunt to ground that, with normal insulation current flowing therethrough, develops a voltage ranging between about 10 to about 140 volts ac RMS, and
   (2) a single voltage reference source operatively associated with each high voltage alternating current bus to which said pieces of equipment, being monitored, are coupled for providing a predetermined fraction of said bus voltage in substantial phase relationship therewith for coupling of same with said external circuit;

said improved apparatus characterized by the fact that if one of said shunt capacitors fails open or a lead operatively associated therewith opens thereby causing the output voltage from a capacitance tap adapter means to be biased upward to normally constitute an apparatus and safety hazard, said improved apparatus limits said output voltage from said capacitor tap adapter means to said external circuit to about 20 to about 280 volts, and said improved apparatus further characterized by the fact that said connecting means for coupling said single voltage reference source with said external circuit is fixedly mounted in a manner so as to substantially eliminate impediments relative to human ingress or egress of the area between said pieces of equipment being monitored and said external circuit remotely located therefrom.

2. The improved apparatus of claim 1 wherein the leads operatively associated with the first side of each of said shunt capacitors are connected to the lead connecting said capacitance tap and said connector means at different points along the length thereof and the leads operatively associated with the second side of each of said shunt capacitors are connected to separate independent ground lugs operatively associated with said capacitor tap adapter means.

3. The improved apparatus of claim 2 wherein said external circuit comprises:

(A) separate interface first circuitry means operatively associated with each said separate connector means to permit conditioning of the voltage signal therefrom;
   (B) second circuitry means in said external circuit means operatively associated with each resulting conditioned voltage signal from each said separate connector means to permit simultaneous power factor and/or capacitance determinations;
   (C) display means operatively associated with said output of said second circuitry means to permit reporting of said determinations;
   (D) constant voltage means, or constant current output means, or both, to drive external readout means, or recorder means, or both; and
   (E) alarm output means operatively associated with said second circuitry means and responsive to predetermined alarm conditions for producing output indicative of events wherein said predetermined alarm conditions are exceeded.

4. The improved apparatus of claim 2 wherein said external circuit comprises:

(A) separate interface first circuitry means operatively associated with each said separate connector means to permit conditioning of the voltage signal therefrom, said interface circuitry including analog-to-digital converter (ADC) means;
(B) second circuitry means, including central processing unit (CPU) means operatively associated with software instruction means, in said external circuit means operatively associated with each resulting conditioned voltage signal from each said separate connector means to permit determinations of power factor and capacitance values intermittently in short-time sequence;
(C) display means operatively associated with said CPU means, to permit reporting of said determinations; and
(D) alarm output means operatively associated with said CPU means, and responsive to predetermined alarm conditions for producing output indicative of events wherein said predetermined alarm conditions are exceeded.

5. The improved apparatus of claim 4 wherein a supplement to said external circuit means is coupled with at least one ambient temperature sensing transducer means for deriving a signal indicative of the ambient temperature environment to which said pieces of equipment are exposed, to permit an output from said supplement to and from said external circuit means of temperature information for use in making temperature corrections in the power factor determinations made by said second circuitry means and associated with each piece being monitored.

6. The improved apparatus of claim 4 wherein at least one pressure transducer means is operatively associated therewith, wherein separate interface circuitry is operatively associated with said at least one pressure transducer means to permit conditioning of the signal therefrom, and wherein said software instruction means operatively associated with said CPU means is provided with additional code to instruct said CPU means for report output, or alarm output, or report and alarm output indicative of the input signals from said at least one pressure transducer means.

7. The improved apparatus of claim 4 wherein at least one electrochemical responsive (ECRR) transducer means is operatively associated therewith, wherein separate interface circuitry is operatively associated with said at least one ECRR transducer means to permit conditioning of the signal therefrom, and wherein said software instruction means operatively associated with said CPU means is provided with additional code to instruct said CPU means for report output, or alarm output, or report and alarm output indicative of the input signals from said at least one ECRR transducer means.

8. The improved apparatus of claim 7 wherein said ECRR transducer means comprises a hydrogen probe.

9. A method for operating apparatus in conjunction with the aid of a digital computer to monitor the insulation quality of a plurality of pieces of high voltage ac electrical equipment while said equipment is operating in its intended environment including being connected to its normal high voltage source which method comprises:
(A) providing said computer with a data base accumulated and utilized in later mentioned steps (B) et seq. for said plurality of pieces of high voltage ac electrical equipment including at least:
(1) analog-to-digital conversions of capacitance tap adaptor and reference voltages for power factor and capacitance computations, which voltages are functions of electrical parameters of the interface network including ADC's operatively associated with said computer, one or more reference voltage sources, and each of the plurality of capacitance tap adapter means coupled with each capacitance tap associated with each of said pieces of equipment being monitored;
(2) analog-to-digital conversions of the analog output of one or more temperature transducers for use in making temperature corrections to power factor computations; and
(3) correction factors for use with the analog output of each of said capacitance tap adapter means to allow said computer to make amplitude, phase, and temperature corrections to power factor and/or capacitance values computed from said analog outputs;
(B) initiating a power on or reset routine to initialize the instruction program operatively associated with said computer;
(C) initiating the startup routine of said instruction program by initializing peripheral ports for printers, terminals, alarms, and analog sampling control interrupters operatively associated with said computer;
(D) clearing to zero all accumulator memory utilized for summations and to clear all status and control flags;
(E) computing correction factors for subsequent use of power factor and capacitance determinations;
(F) sequencing to a wait-for-event routine to determine status of check time instructions wherein:
(1) if check time instructions are no, proceed to keyboard entry instructions for manually entered operator entries including system parameters wherein:
(a) if keyboard entry instructions are yes, update variables, and/or list variables, test command tables, and/or print records, and return same to said check time instruction of wait-for-event routine (F) supra; or
(b) if keyboard entry instructions are no, return to said check time instruction of wait-for-event routine (F) supra;
(2) if check time instructions are yes, initiate action instruction set including:
(a) begin measure subroutine with setup for data accumulation, clear memories, initialize counter and pointers, and setup arrays for data accumulations;
(b) begin analog-to-digital conversion and data accumulation;
(c) repetitively performing intermediate accumulation of power factors and capacitance values for each of said pieces of equipment being monitored by repetitively performing computations, including numerical integrations to calculate, from a series of reference voltage and capacitance tap current measurements summed for 16 cycles at 32 sample times throughout each cycle, both the power factor and capacitance characteristics of each of said pieces of equipment according to the following formulas, which formulas include correction for the 90 degree delay caused by the capacitive shunt in the capacitance tap adaptors:

$$\% \text{ POWER FACTOR} = D + 100(\Sigma X_n Y_{(n-8)})/((\sqrt{\Sigma X_n^2})(\sqrt{\Sigma Y_n^2}))$$

ESTIMATED INTERNAL TEMPERATURE =

$$T_{i(m)} = AT_{a(m)} + BT_{i(m-1)}$$

TEMPERATURE CORRECTED % POWER FACTOR =

$$[\% \text{ POWER FACTOR}] [H_0 + H_1(T_i - 68) + H_2(T_i - 68)^2 + H_3(T_i - 68)^3 + \ldots H_8(T_i - 68)^8]$$

$$\text{CAPACITANCE}, pf = (C_s G_p \sqrt{\Sigma X_n^2})/(R_p G_c \sqrt{\Sigma Y_n^2})$$

where:
D is a correction factor, determined during calibration, to compensate for phase shift in the analog circuits;
X and Y are the sample sums of the voltages delivered to the computer from the capacitance tap adaptor and the referenced source, respectively;
$T_i$ is the most recently computed estimated internal temperature in degrees Fahrenheit;
$T_{i(m)}$ is the estimated internal temperature being computed;
$T_{i(m-1)}$ is the estimated internal temperature computed one measurement period previously;
$T_{a(m)}$ is the most recently measured ambient temperature in degrees Fahrenheit;
A is 1/K;
K is the time constant expressed in units of the measurement period (usually minutes;
B is 1−A;
$H_0, H_1, H_2, H_3 \ldots H_8$ are the coefficients of the best fit eighth order power series, computed by the method of least squares, to describe the power factor temperature characteristics according to the standard instrument transformer correction curve;
$C_s$ is the total shunt capacitance, including the capacitance tap, the capacitance tap adaptor, and the cable, in picofarads (pf);
$R_p$ is the potential transformer (pt) ratio;
$G_p$ is the gain of the voltage reference interface amplifier; and
$G_c$ is the gain of the capacitance tap interface amplifier;
wherein all summations in the above formulas are carried out from n=1 to n=32, the number of samples per cycle; and (G) continuing said repetitively performed computations, until all samples for a predetermined measurement interval set forth in said check time instruction of wait-for-event routine (F) supra are obtained;
(H) determine the final results of, for each piece of equipment being monitored, the percent power factor, the temperature corrected percent power factor, and the capacitance;
(I) determine good data from (H) supra and reject bad data;
(J) sum said good data from (I) supra to accumulators for monthly and daily averaging;
(K) determine events outside predetermined limits of alarm conditions;
(L) determine if data should be printed, and if so print data and averages as required; and
(M) return to said check time instruction of said wait-for-event routine (F) supra.

10. A continuous monitoring system for simultaneously determining, in situ, the insulation characteristics of a plurality of separate pieces of high voltage alternating current electrical equipment including instrument transformers, high voltage bushings of power circuit breakers and transformers, and other like equipment, each of said pieces of electrical equipment being provided with a capacitance tap, said system comprising:
(A) separate capacitance tap adapter means operatively associated with each of said capacitance taps;
(B) separate impedor means operatively associated with each of said capacitance tap adapter means and having an electrical impedance so low that current in said impedor means is substantially determined by the impedance of the insulation of said pieces of equipment being monitored; said impedor means comprising at least two shunt capacitors of capacitance value selected such that added together they provide a shunt to ground that, with normal insulation current flowing therethrough, develops a voltage ranging between about 10 to about 140 volts ac RMS;
(C) separate connector means permanently associated with each said impedor means for permitting coupling of a later mentioned external circuit to said impedor means without interruption of current through said insulation;
(D) voltage reference source means operatively associated with high voltage alternating current bus means common with each group of said pieces of equipment being monitored and coupled therewith for providing a predetermined fraction of each bus voltage associated with each such voltage reference source means and in substantial phase relationship therewith for coupling with later mentioned external circuit means; and
(E) external circuit means adapted to be coupled with said voltage reference source means and each of said impedor means, and responsive to signals from said voltage reference source means and to signals applied to said impedor means from said pieces of electrical equipment, the insulation characteristics thereof being monitored, said external circuit means comprising, for each said piece of electric equipment being monitored, either in total or on a time-share basis:
(1) voltage interface amplifier means predisposed for providing compatibility of the voltage supplied by said capacitor tap adapter means to said external circuit means and characterized by its substantial elimination of all 60 Hz interference from extraneous high current conducters juxtaposed said separate connector means, said voltage interface amplifier means comprising transient supressor means, low-pass filter means and differential amplifier means and outputting substantially true square waveforms of the voltage signals from said voltage reference source means and said separate capacitance tap adapter means with transitions at 0° and 180° of said voltage signals;

(2) noninverting buffer means operatively associated with said voltage interference amplifier means for providing waveforms therefrom in a form fully compatible with later mentioned circuitry and comprising first gate means having a positive output when the waveforms outputted from step (E)(1) supra are instantaneously of opposite polarity, thus having a zero output when said waveforms are exactly in phase and have the same symetry, and said first gates predisposed such that when said waveforms are but slightly out of phase with one another the output therefrom comprises a string of relatively short pulses with the length and position of said pulses being in proportional relationship with the time between the zero crossing of said two waveforms;

(3) monostable multivibrator means including timing network means for outputting pulses substantially longer than said short pulses in said string of relatively short pulses in step (E)(2) supra for determining which of two said waves first crosses zero, said zero and said zero crossings relative to the midpoint of the power supply voltage;

(4) second gate means operatively associated with the output from step (E)(3) supra for outputting either a positive going, or a negative going pulse indicative of which of said waveforms is first reaching said zero crossing;

(5) current summing amplifier means operatively associated with the output from step (E)(4) supra and provided with inverting means such that said negative going pulses drives the output therefrom positive and said positive going pulse drives the output therefrom negative thereby providing circuit means for effecting both positive and negative power factor determinations and predetermined alarm conditions by outputting predetermined signals to any of several possible output conditioning means.

11. The continuous monitoring system of claim 10 wherein said output conditioning means comprises, for each said piece of electrical equipment being monitored, either separately or on a time-share basis:

(A) voltage supply means having an output being substantially directly proportional to percent power factor through the range of power factor from 0.01 to about 20 percent;

(B) current pump means for providing a predetermined current output substantially independent of the resistive impedance associated with the readout or other device coupled to and utilizing said current pump means and having an output being substantially directly proportional to percent power factor through the range of power factor from about 0.01 to about 20 percent;

(C) analog display means, or digital display means, or analog and digital display means, said display means having an output being substantially a direct indication of percent power factor through the range of power factor from about 0.01 to about 20 percent;

(D) voltage comparater means for driving alarm means operatively associated therewith upon an output voltage therefrom reaching a predetermined value; and (E) alarm means comprising a relay having a normally open dry contact, or a normally closed dry contact, or a normally open dry contact and normally closed dry contact.

12. A continuous monitoring system for simultaneously determining, in situ, the insulation characteristics of a plurality of separate pieces of high voltage alternating current electrical equipment including instrument transformers, high voltage bushings of power circuit breakers and transformers, and other like equipment, each of said pieces of electrical equipment being provided with a capacitance tap, said system comprising:

(A) separate capacitance tap adapter means operatively associated with each of said capacitance taps;

(B) separate impedor means operatively associated with each of said capacitance tap adapter means and having an electrical impedance so low that current in said impedor means is substantially determined by the impedance of the insulation of said pieces of equipment being monitored; said impedor means comprising at least two shunt capacitors of capacitance value selected such that added together they provide a shunt to ground that, with normal insulation current flowing therethrough, develops a voltage ranging between about 10 to about 140 volts ac RMS;

(C) separate connector means permanently associated with each said impedor means for permitting coupling of later mentioned first external circuit means to said impedor means without interruption of current through said insulation;

(D) voltage reference source means operatively associated with high voltage alternating current bus means common with each group of said pieces of equipment being monitored and coupled therewith for providing a predetermined fraction of each bus voltage associated with each such voltage reference source means and in substantial phase relationship therewith for coupling with later mentioned first external circuit means;

(E) first external circuit means adapted to be coupled with said voltage reference source means and each of said impedor means and responsive to signals from said voltage reference source means and to signals applied to said impedor means from said pieces of electrical equipment, the insulation characteristics thereof being monitored, said first external circuit means comprising voltage interface attenuator/amplifier means predisposed for providing, through later mentioned ADC means, compatibility between later mentioned CPU means and the voltage supplied by said capacitance tap adapter means, said voltage interface attenuator/amplifer means characterized by its substantial elimination of all 60 Hz interference from extraneous high current conducters juxtaposed said connector means operatively associated with said first external circuit means, said voltage interface attenuator/amplifier means comprising transient suppressor means, low-pass filter means, and differential amplifier means;

(F) ambient temperature probe means operatively associated with said pieces of equipment being monitored and coupled through later mentioned ADC means to later mentioned CPU means;

(G) microcomputer means operatively associated with said first external circuit means and said ambient temperature probe means, said microcomputer means comprising ADC means, CPU means, parallel interface means, battery backed random access memory means, realtime clock means, and power supply means; and (H) second external circuit means comprising synchronized frequency multiplier means operatively associated with said ADC means and adapted to be coupled therewith, provide timing pulses therefore, and therethrough determine the number and timing of voltage samples taken each cycle of each input wave of the signals applied by said bus means to said impedor means.

13. The continuous monitoring system of claim 12 wherein said ambient temperature probe means is coupled with transducer interface amplifier means for direct operative association with said microcomputer means.

14. The continuous monitoring system of claim 12 in combination with hydrogen transducer means, hydrogen monitor means, and differential amplifier means for input to said microcomputer means of information determitive of dissolved hydrogen in the oil of an oil and paper bushing or transformer.

15. The continuous monitoring system of claim 12 in combination with pressure transducer means, transducer excitation and amplifier means, and transducer interface amplifier means for input to said microcomputer means of information determinative of the pressure of the oil of an oil and paper bushing or transformer.

* * * * *